United States Patent [19]
Bosshart

[11] Patent Number: 5,982,702
[45] Date of Patent: Nov. 9, 1999

[54] DYNAMIC LOGIC MEMORY ADDRESSING CIRCUITS, SYSTEMS, AND METHODS WITH PREDECODERS PROVIDING DATA AND PRECHARGE CONTROL TO DECODERS

[75] Inventor: Patrick W. Bosshart, Plano, Tex.

[73] Assignee: Texas Instruments Incorporated, Dallas, Tex.

[21] Appl. No.: 09/159,552

[22] Filed: Sep. 24, 1998

Related U.S. Application Data

[60] Provisional application No. 60/060,676, Sep. 25, 1997.

[51] Int. Cl.$^6$ ........................................ G11C 8/00
[52] U.S. Cl. ................... 365/230.06; 365/233; 326/95; 326/108
[58] Field of Search ................... 365/203, 210, 365/230.06, 233; 326/93, 95, 105, 108, 119

[56] References Cited

U.S. PATENT DOCUMENTS

| | | | |
|---|---|---|---|
| 4,194,130 | 3/1980 | Moench | 326/106 |
| 5,117,133 | 5/1992 | Luebs | 326/93 |
| 5,258,666 | 11/1993 | Furuki | 326/95 |
| 5,278,802 | 1/1994 | Kersh, III et al. | 365/230.06 |
| 5,389,835 | 2/1995 | Yetter | 326/98 |
| 5,412,331 | 5/1995 | Jun et al. | 326/105 |
| 5,440,243 | 8/1995 | Lyon | 326/33 |
| 5,459,693 | 10/1995 | Komarek et al. | 365/207 |
| 5,483,181 | 1/1996 | D'Souza | 326/98 |
| 5,530,659 | 6/1996 | Anderson et al. | 326/95 |
| 5,541,537 | 7/1996 | Kim et al. | 326/121 |
| 5,541,885 | 7/1996 | Takashima | 365/226 |
| 5,572,151 | 11/1996 | Hanawa et al. | 326/113 |
| 5,594,371 | 1/1997 | Douseki | 326/119 |
| 5,602,497 | 2/1997 | Thomas | 326/93 |
| 5,661,675 | 8/1997 | Chin et al. | 326/95 |
| 5,703,828 | 12/1997 | Park et al. | 365/230.03 |
| 5,821,778 | 10/1998 | Bosshart | 326/95 |
| 5,831,451 | 11/1998 | Bosshart | 326/93 |

Primary Examiner—Son Mai
Attorney, Agent, or Firm—Rebecca Mapstone Lake; Richard L. Donaldson

[57] ABSTRACT

A memory configuration (10) for outputting information in response to an address (A0–A7), the configuration including an array of memory cells (12) aligned in an array. The configuration further includes a plurality of predecoders (PD0, PD1, PD2), each operable to receive a corresponding portion of the address, and a plurality of decoder sets (DECODER SET 1–8), each having a plurality of wordline enable outputs ($WL_0$–$WL_{255}$). Each of the plurality of predecoders comprises a plurality of predecoder precharge nodes (e.g., $PN_0$–$PN_3$), a plurality of predecoder conditional series discharge paths (e.g., $\overline{TA50}$, $\overline{TA60}$, and DT) and a plurality of predecoder inverters (e.g., $INV_0$–$INV_3$). Each of the plurality of decoder sets comprises a plurality of decoder precharge nodes (e.g., $PN_0$–$PN_{31}$), a plurality of decoder conditional series discharge paths (e.g., $TPD2_{0/0}$, $TPD1_{0/0-7}$, and $TPD0_{0/0-31}$), and a plurality of inverters ($INV_0$–$INV_{31}$). Each of the plurality of decoder conditional series discharge paths is connected to a corresponding one of the plurality of decoder precharge nodes and is operable in response to selected ones of the data signals from the plurality of predecoder inverters to discharge the precharge voltage at the corresponding decoder precharge node during a decoder evaluate phase. Each of the plurality of decoder inverters has an input coupled to a corresponding one of the plurality of decoder precharge nodes and an output for providing one of the plurality of wordline enable outputs. Lastly, one of the plurality of predecoders (PD2) further comprises a plurality of precharge output signal circuits (20), each coupled to a corresponding one of the plurality of predecoder precharge nodes and for providing a precharge output signal for commencing the decoder precharge phase of a group of the plurality of decoder precharge nodes.

21 Claims, 9 Drawing Sheets

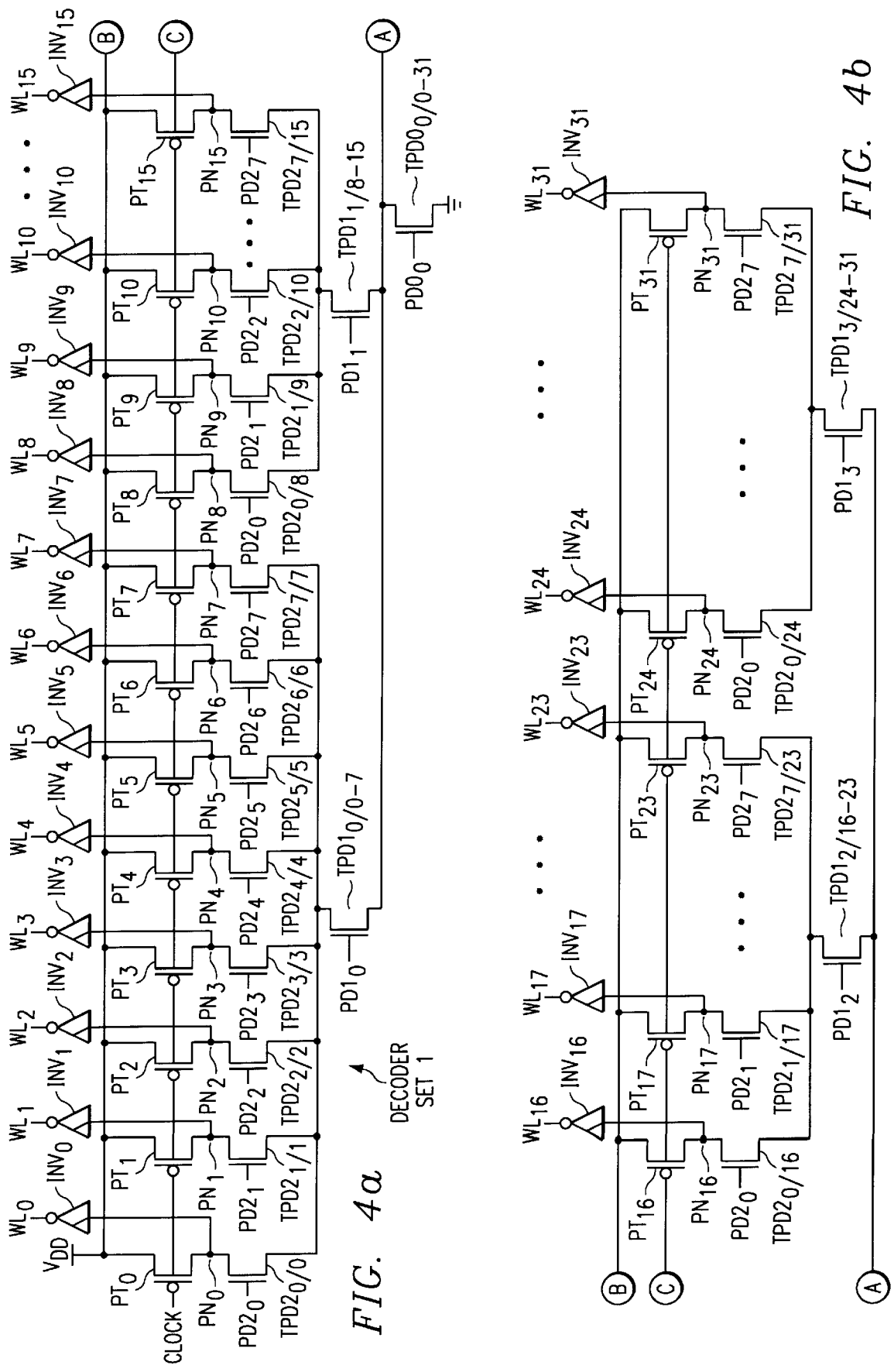

DYNAMIC LOGIC MEMORY ADDRESSING CIRCUITS, SYSTEMS, AND METHODS WITH PREDECODERS PROVIDING DATA AND PRECHARGE CONTROL TO DECODERS

This application claims priority under 35 USC §119(e)(1) of Provisional Application No. 60/060,676, filed Sep. 25, 1997.

CROSS-REFERENCES TO RELATED APPLICATIONS

This application is related to the following two applications, both of which are hereby incorporated herein by reference:

(1) U.S. patent application Ser. No. 09/158,709, (Attorney docket TI-23619), entitled "Dynamic Logic Memory Addressing Circuits, Systems, And Methods With Decoder Fan Out Greater Than 2:1", filed on the same date as the present application, and having the same inventor as the present application; and (2) U.S. patent application Ser. No. 09/160,270, (Attorney docket TI-26704), entitled "Dynamic Logic Memory Addressing Circuits, Systems, And Methods With Reduced Capacitively Loaded Predecoders", filed on the same date as the present application, and having the same inventor as the present application.

STATEMENT REGARDING FEDERALLY SPONSORED RESEARCH OR DEVELOPMENT

Not Applicable.

BACKGROUND OF THE INVENTION

The present embodiments relate to digital memory circuits, and are more particularly directed to dynamic logic memory addressing circuits, systems, and methods with predecoders providing data and precharge control to decoders.

The technology of many modern circuit applications continues to advance at a rapid pace, with consideration given to all aspects of design. Designers constantly strive to increase performance, while maximizing efficiency. One incredibly prolific type of circuit, and one which is highly developed, is digital memory. Digital memories are implemented either as stand-alone products, or as part of a larger circuit such as a microprocessor. With respect to performance of the digital memory, greater overall circuit speed is achieved by improving the speed of various circuits of the memory, where those circuits operate to receive an address, decode the address, and either input or output information at the storage location specified by the address. Consequently, in memory design the circuits which make up speed-limiting portions or affect the speed of the memory are constantly scrutinized and redesigned to increase the overall speed. Increased speed increases performance and, therefore, permits more detailed and sophisticated input/output capabilities in a shorter amount of time. As another consideration, the cost of the device also must be considered. This cost is often reflected in the overall size of the memory architecture as well as in connection with its power requirements. Thus, a desirable memory design balances the considerations of speed with cost, and is reviewed extensively by the present embodiments described below.

BRIEF SUMMARY OF THE INVENTION

The embodiments include a memory configuration for outputting information in response to an address, the configuration including an array of memory cells aligned in an array having an integer number N of wordlines. The configuration further includes a plurality of predecoders, each operable to receive a corresponding portion of the address, and a plurality of decoder sets, each having a plurality of wordline enable outputs. Each of the plurality of wordline enable outputs corresponds to a respective one of the integer number N of wordlines and is operable to assert an enabling signal to the respective one of the integer number N of wordlines. Each of the plurality of predecoders comprises a plurality of predecoder precharge nodes, a plurality of predecoder conditional series discharge paths, and a plurality of predecoder inverters. Each of the plurality of predecoder precharge nodes is operable to be precharged to a precharge voltage during a predecoder precharge phase. Each of the plurality of predecoder conditional series discharge paths is connected to a corresponding one of the plurality of predecoder precharge nodes and is operable in response to the corresponding portion of the address to discharge the precharge voltage at the corresponding predecoder precharge node during a predecoder evaluate phase. Each of the plurality of predecoder inverters has an input coupled to a corresponding one of the plurality of predecoder precharge nodes and has an output for providing a data signal. Each of the plurality of decoder sets comprises a plurality of decoder precharge nodes, a plurality of decoder conditional series discharge paths, and a plurality of decoder inverters. Each of the plurality of decoder precharge nodes is operable to be precharged to a precharge voltage during a decoder precharge phase. Each of the plurality of decoder conditional series discharge paths is connected to a corresponding one of the plurality of decoder precharge nodes and is operable in response to selected ones of the data signals from the plurality of predecoder inverters to discharge the precharge voltage at the corresponding decoder precharge node during a decoder evaluate phase. Each of the plurality of decoder inverters has an input coupled to a corresponding one of the plurality of decoder precharge nodes and an output for providing one of the plurality of wordline enable outputs. Lastly, one of the plurality of predecoders further comprises a plurality of precharge output signal circuits, each coupled to a corresponding one of the plurality of predecoder precharge nodes. Each of the plurality of precharge output signal circuits is for providing a precharge output signal for commencing the decoder precharge phase of a group of the plurality of decoder precharge nodes.

BRIEF DESCRIPTION OF THE SEVERAL VIEWS OF THE DRAWING

FIGS. 4a and 4b illustrate a schematic of a decoder set of FIG. 1 having 32 outputs, each operable to enable one of 32 corresponding wordlines in the storage circuit;

DETAILED DESCRIPTION OF THE INVENTION

Figure 1:
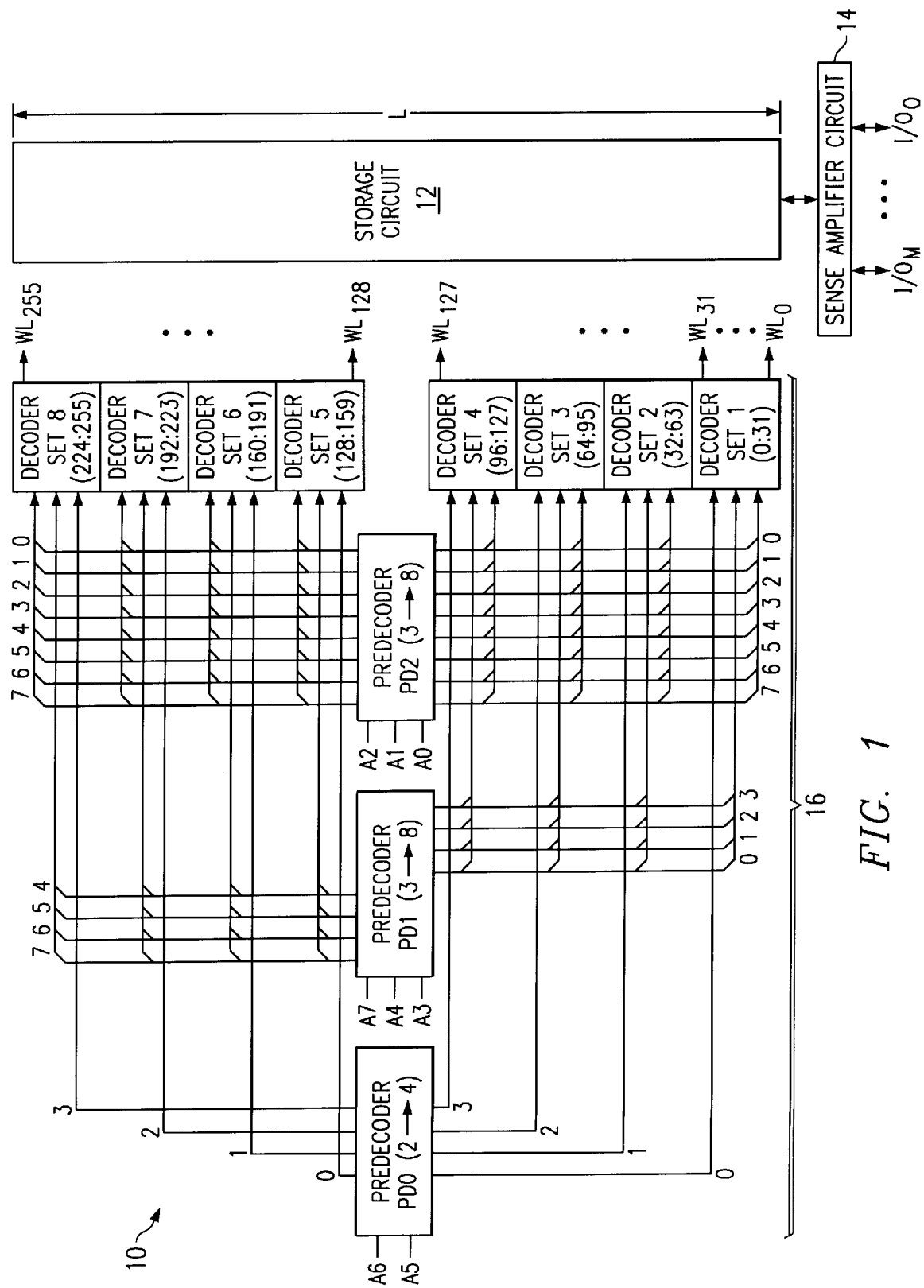
FIG. 1 illustrates a layout of the predecoders, decoder sets, and storage circuit of a first inventive embodiment, with additional detail with respect to the length of the conductors between the predecoders and decoder sets which result from the type of circuitry preferably used to implement the predecoders and decoder sets.

FIG. 1 illustrates a block diagram and layout depiction of a memory configuration 10 in accordance with the present inventive embodiments. Memory configuration 10 includes a storage circuit 12 which may be of various types of known architectures ascertainable by one skilled in the art Typically, such storage architectures implement a two dimensional array, and include either SRAM or DRAM memory cells. Accordingly, storage circuit 12 includes a number of storage cells, which are addressable based on the row or "wordline" of the cell as that term is known in the art In the present embodiment, storage circuit 12 includes 256 wordlines (shown as $WL_0$ through $WL_{255}$), while it is noted that many of the inventive aspects set forth in this document may apply in conjunction with an alternative storage circuit having more or less than 256 wordlines. As is known in the art, a given wordline of storage circuit 12 is accessed by providing an enabling signal to the wordline, after which data may be read from, or written to, the storage cells located along that wordline. In this regard, storage circuit 12 is further shown to connect to a sense amplifier circuit 14 which operates according to known principles to sense the data along either some or all of the columns for the wordline which is then activated. Input/output is available from sense amplifier circuit 14 along pins designated as $I/O_0$ through $I/O_M$.

Memory configuration 10 further includes an address decoder circuit designated generally at 16. In general, address decoder circuit 16 operates in one respect as known in the art, that is, to receive an N bit address and to decode it so that one of $2^N$ wordlines is enabled in response to that address. In the present embodiment, therefore, N equals eight and any of 256 wordlines (i.e., $2^8=256$) may be activated by address decoder circuit 16. To establish a convention for use in this document, these eight address bits are shown as A0 through A7, the connection of which is detailed below. Given the above-stated general operation, the following discussion and the corresponding Figures detail numerous aspects of address decoder circuit 16 which provide various inventive attributes.

Address decoder circuit 16 includes three predecoders, designated generally as PD0, PD1, and PD2. PD0 is a 2-to-4 bit decoder, meaning it is operable to receive two bits of input and, in response to the states of those bits, to activate one of its four outputs. Both PD1 and PD2 are 3-to-8 decoders. Thus, each of PD1 and PD2 is operable to receive three bits of input and, in response to the states of those bits, to activate one of eight outputs. Given this general operation of PD0, PD1, and PD2, note that they perform the preliminary operation of pre-decoding on the eight address bits A0 through A7 introduced above. Thus, by way of example, consider that bits A6 and A5 are connected to PD0 to activate at one time any one of its four outputs (labeled 0 through 3), bits A7, A4, and A3 are connected to PDI to activate at one time any one of its eight outputs (labeled 0 through 7), and bits A2, A1, and A0 are connected to PD2 to activate at one time any one of its eight outputs (also labeled 0 through 7).

Address decoder circuit 16 further includes eight decoder set circuits, designated as decoder set 1 through decoder set 8. As detailed later, each decoder set is comparably constructed, and provides 32 outputs to a corresponding set of 32 of the total of 256 wordlines of storage circuit 12. For example, the 32 outputs of decoder set 1 (shows as 0 through 31) are connected to respective wordlines $WL_0$ through $WL_{31}$. Similarly, the 32 outputs of decoder set 8 (shown as 224 through 255) are connected to respective wordlines $WL_{224}$ through $WL_{255}$. For reasons more clear below, note from FIG. 1 that each decoder set receives a total of thirteen inputs from outputs of PD0, PD1, and PD2. In this regard, note that eight of the inputs for each of the decoder sets are the eight outputs from PD2. However, the remaining five inputs for each of the decoder sets depends on the particular decoder set For example, note that the decoder sets in total are separated into a bottom half (i.e., sets 1 through 4) and a top half (i.e., sets 5 through 8). Each of the decoder sets in the bottom half receive bits 0 through 3 from PD1 at four of their inputs, while each of the decoder sets in the top half receive bits 4 through 7 from PD1 at four of their inputs. Having described twelve of the thirteen data inputs to each of the decoder sets, note lastly that the thirteenth data input for each set is connected such that the same input is connected to pairs of the predecoder sets. For example, bit 0 from PD0 is connected as the thirteenth data input to both decoder set 1 and decoder set 5. As another example, bit 3 from PD0 is connected as the thirteenth data input to both decoder set 4 and decoder set 8. The remaining connections are shown in FIG. 1, and will be appreciated by one skilled in the art.

Given the connections between the predecoders and decoder sets described above, note that FIG. 1 further illustrates in a general layout fashion one aspect of the present embodiment as it pertains to conductor length. More specifically, note that the requirement of 256 parallel word-lines of storage circuit 12 generally defines a length, L, in the vertical dimension shown in FIG. 1. For example, under current technology, L may be on the order of 1 mm. In any event, given the connections described above as well as the schematics detailed below for the predecoders and decoders sets, note that not all of the output conductors from each of PD0, PD1 and PD2 are required to span the entire distance of L. For example, the eight output conductors of PD2 extend in the directions of both the top and bottom half of storage circuit 12; thus, these conductors span approximately the entire length of L and, therefore, there is a requirement of approximately 8L of overall conductor length in connection with PD2. In contrast, however, only four of the eight output conductors of PD1 (carrying signals 0 through 3) extend in the direction of the bottom half of storage circuit 12 while the other four of the eight output conductors of PD1 (carrying signals 4 through 7) extend in the direction of the top half of storage circuit 12. Thus, each set of these four conductors span only approximately 0.5L and, therefore, there is a requirement of approximately 4L of overall conductor length in connection with PD1. Lastly, due to the pairing connections from PD0 to the decoder sets, each output signal is provided along a conductor which extends a larger length x in either the direction of the top or bottom half of storage circuit 12, while that same conductor extends a shorter length of approximately 0.625L-x in the opposite direction of either the top half or bottom half of storage circuit 12. Therefore, there is a requirement of approximately 2L of overall conductor length in connection with PD0.

Figure 2:
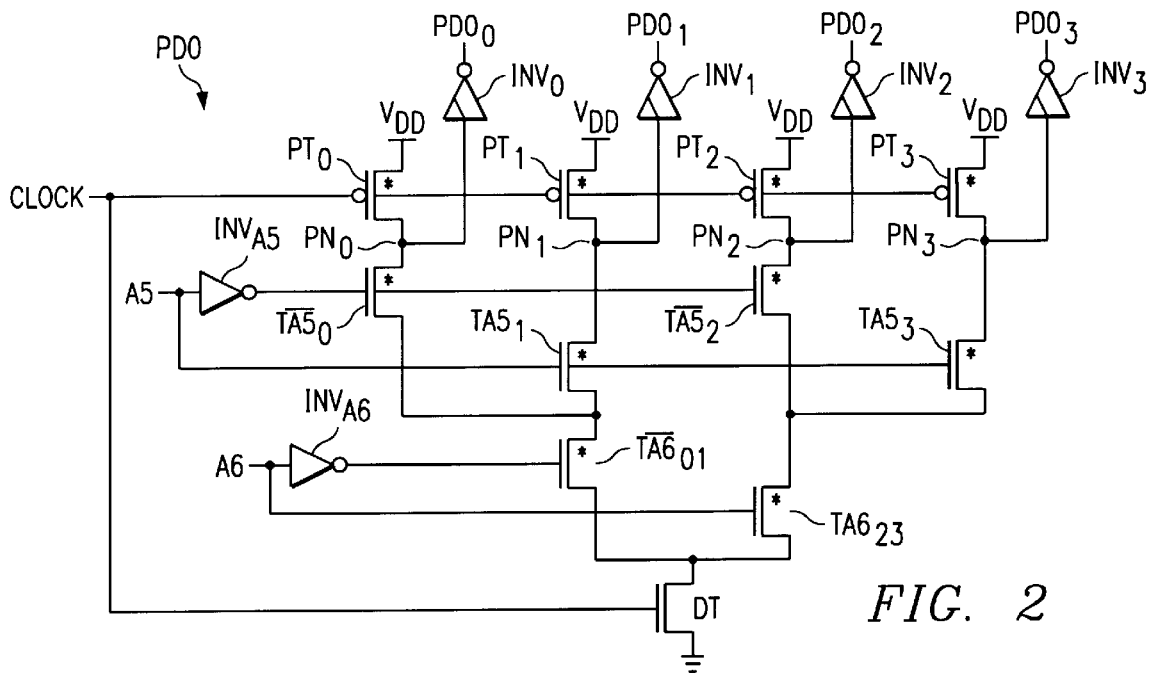
FIG. 2 illustrates a schematic of the 2-to-4 predecoder of FIG. 1 (PD0), wherein the predecoder accomplishes its 2-to-4 decoding operation using dynamic logic circuitry.

FIG. 2 illustrates a schematic of the preferred embodiment of predecoder PD0 shown in FIG. 1, above. In general, one skilled in the art will appreciate that PD0 is constructed using dynamic logic transistor circuits. By way of introduction, a dynamic logic circuit is characterized by operating in two phases. First, a precharge node is set to a first potential during a precharge phase. Second, during an evaluation phase, if a logic condition represented by the circuit is satisfied, the precharge node is discharged, thereby changing the logic output of the circuit In other words, at the conclusion of the precharge phase, the precharged charge at the precharge node causes a first logic state to be output by the dynamic logic circuit, and if the precharge node is discharged during the evaluate phase, the output of the dynamic logic circuit represents a second logic state differing from the first logic state. Given this introduction, the components and connections of PD0 are described in more detail below.

The dynamic logic circuitry of PD0 is perhaps more straightforward by first considering the four outputs of PD0, shown as $PD0_0$ through $PD0_3$. Each output is provided by an output inverter, which is labeled by combining the abbreviation "INV" with a subscript, where the subscript recites the output number corresponding to the inverter. For example, output bit $PD0_0$ is provided from inverter $INV_0$. The input of each of the four output inverters $INV_0$ through $INV_3$ is connected to a corresponding precharge node, which is labeled by combining the abbreviation "PN" with a subscript, where the subscript recites the output number corresponding to the precharge node. For example, output inverter $INV_0$ has its input connected to precharge node $PN_0$. Each precharge node is connected to the drain of a corresponding p-channel precharge transistor, where the source of the p-channel transistor is connected to a high reference potential $V_{DD}$ and the gate of the p-channel transistor is connected to receive a CLOCK signal. Each p-channel precharge transistor is labeled by combining the abbreviation "PT" with a subscript, where the subscript again recites the output number corresponding to the precharge transistor. For example, precharge transistor $PT_0$ is connected to precharge node $PN_0$, which recall corresponds to output bit $PD0_0$.

As is known in the dynamic logic circuit art, each precharge node is connected to at least one discharge path. The discharge path includes one or more transistors which, if enabled during the evaluate phase of operation, permits the charge at the precharge node to discharge to a different potential such as ground. In the present embodiment, each of the transistors in each discharge path is an n-channel transistor; thus, as known in the art for n-channel transistors, they are enabled by a having a relatively high gate-to-source voltage. Note that the term "enabled" is known in the art, and indicates that the gate potential to the transistor is sufficient to cause conduction along the conductive path (i.e., the source/drain) of the transistor to which the gate potential is connected. Similarly, in the present document the term disabled or disabling is used in opposite fashion to indicate that the gate potential to the transistor is insufficient to cause conduction along the conductive path of the transistor.

PD0 includes numerous discharge paths, each of which connects to a corresponding precharge node and which may discharge its corresponding precharge node to ground if a condition is met (i.e., the condition being met if all n-channel transistors in the discharge path are concurrently enabled). For example, looking to the far left side of FIG. 2, it begins with $PN_0$ which is connected to a discharge path having three transistors which, if conducting, form a path to ground. The upper nchannel transistor in this path receives the complement of address bit A5 at its gate, and is labeled $T\overline{A5}_0$ which combines the letter "T" (for "transistor") with the input signal (i.e., $\overline{A5}$), and also includes a subscript which indicates the output (i.e., bit 0) which may be affected if the transistor conducts during the evaluate phase. Continuing with the discharge path at the far left side of FIG. 2, below $T\overline{A6}_{01}$ is an n-channel transistor which receives the complement of the address bit A6 at its gate, and is labeled as such to combine the abbreviation "T" with the input signal (i.e., $\overline{A6}$), and adds a subscript which indicates the outputs (i.e. either bit 0 or bit 1) which may be affected if the transistor conducts during the evaluate phase. Below $T\overline{A6}_{01}$ in the same far left discharge path is a discharge transistor labeled DT, and which is connected to receive the CLOCK signal at its gate so that it operates in a complementary fashion relative to the precharge transistors. Thus, when the precharge transistors are disabled by a CLOCK transition from low to high, the same signal enables DT so that one of the four precharge nodes $PN_0$ through $PN_3$ discharges to ground (i.e., the precharge node which is connected to two other series-connected transistors which also are conducting). Lastly, without re-stating the above details with respect to the remaining transistors in FIG. 2, one skilled in the art will be able to trace through the remaining discharge paths of the structure to verify that connections and conventions comparable to those just described are used for the remaining components of FIG. 2.

Given the multiple discharge paths and the common structure of each such path in PD0, an additional observation is noteworthy with respect to the structure of PD0. Specifically, note that the n-channel transistors located in the same relative position of each discharge path may be thought of as forming a level in a tree structure. For example, in PD0, an upper level is formed by all of the first n-channel transistors first connected to the precharge nodes; in other words, transistors $\overline{TA5}_0$, $TA5_1$, $\overline{TA5}_2$, and $TA5_3$ form an upper level in the tree structure of PD0. Similarly, a middle level in the tree structure is formed by all of the n-channel transistors connected to the respective transistors in the upper level; thus, transistors $\overline{TA6}_{01}$ and $TA6_{23}$ form a middle level in the tree structure of PD0. Lastly, DT forms a lower level in PD0. These types of level descriptions are useful for later discussion concerning PD0, and also apply to various other circuits described later.

The operation of PD0 is as follows. Recall it is stated above that the dynamic logic circuit operates in two phases. Thus, during the first or "precharge" phase of operation, the CLOCK signal is low and therefore each of $PT_0$ through $PT_3$ conducts; consequently; each of $PN_0$ through $PN_3$ is precharged to $V_{DD}$ and outputs $PD0_0$ through $PD0_3$ are low. Next, to commence the second or "discharge" phase of operation, the CLOCK signal transitions from low to high, thereby causing DT to conduct Additionally, either at that transition or thereafter the address bit values of A0 and A1 are input to PD0. In response, one skilled in the art will appreciate that only one of the four discharge paths of PD0 conducts. Consequently, the one conducting discharge path brings its precharge node to ground, thereby causing its corresponding output to rise from low to high. In this regard, Table 1 below illustrates the value of the output bits $PD0_0$ through $PD0_3$ based on the values shown for A0 and A1 during the evaluate phase of operation of PD0.

TABLE 1

| A6 | A5 | $PD0_0$ | $PD0_1$ | $PD0_2$ | $PD0_3$ |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

Given Table 1, therefore, note that PD0 operates in the manner described earlier in connection with FIG. 1, that is, to assert one of four outputs based on a combination of two input signals (i.e., A0 and A1). As now demonstrated, this operation is preferably achieved using the two phase operation of the dynamic logic circuitry as just described. Note, therefore, that this operation is beneficial in that the two phase operation may improve speed performance over other alternative techniques such as static logic. Moreover, as described below, this speed may be further increased by additional considerations as well.

As another observation with respect to PD0 of FIG. 2, note with respect to each inverter $INV_0$ through $INV_3$ that its schematic symbol is shown as having a short diagonal line in the upper half of the inverter symbol (which is to the left based on the orientation of FIG. 2). For purposes of this document, this symbol is included as a convention to demonstrate that a p-channel transistor (not expressly illustrated) is connected in a feedback manner from the output of the inverter to its input. More particularly, the gate of the feedback p-channel transistor is connected to the output of the corresponding inverter, the source of the feedback p-channel transistor is connected to $V_{DD}$, and the drain of the feedback p-channel transistor is connected to the input of the corresponding inverter. One skilled in the art will therefore appreciate that once the precharge voltage is no longer connected to a given precharge node in FIG. 1 (e.g., during the evaluate phase described below), the feedback p-channel transistor will maintain a high signal at the input of the inverter so long as the precharge node is not discharged by its corresponding discharge path.

Returning again to the structure of FIG. 2, and focusing on another aspect to improve its speed performance, note that asterisks are shown by each of the n-channel transistors of PD0 other than DT. In the preferred embodiment, the threshold voltage ("$V_T$") of each of these asterisk-marked n-channel transistors is lower than that of the n-channel discharge transistor DT. Note that the use of an asterisk in this manner, that is, to designate a low threshold voltage transistor, is followed in other following Figures as well. Before detailing the significance of the use of a low threshold voltage transistor versus a high threshold voltage transistor, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this document, a transistor of the first type will be referred to as an HVT transistor (i.e., a transistor with a relatively high $V_T$) while a transistor of the second type will be referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. Note also that although an LVT transistor provides the benefit of a higher drive current as opposed to an HVT transistor, in contrast it gives rise to the detriment that it provides a greater leakage current (i.e., when not conducting) than an HVT transistor. Indeed, the typical leaking by an LVT transistor may be greater than that of an HVT transistor by two or three orders of magnitude or more. Lastly, note that the transistor $V_T$ considerations just described as well as additional results from those considerations are further explored in U.S. patent application Ser. No. 08/687,800 (Attorney Docket TI-22618), entitled "Dynamic Logic Circuits Using Transistors Having Differing Threshold Voltages", having the same inventor as the current application, and filed Jul. 19, 1996, and which is hereby incorporated herein by reference.

Having explained above the use of asterisk indications with respect to various n-channel transistors in FIG. 2, note further that the pchannel precharge transistors are also asterisk marked to represent LVT transistors. Thus, these p-channel transistors have a threshold voltage which is relatively smaller than other p-channel transistors within the circuit. In this regard, note that the reduced threshold voltage provides a greater amount of drive current for these devices. Consequently, the size of each of these channel transistors may be smaller than it would be to accomplish the same current drive capability if a transistor with a higher threshold voltage were used. One skilled in the art, therefore, will appreciate that such an approach further enhances the design by reducing overall device size.

Returning now to the operation of PD0, recall that the n-channel transistors marked with an asterisk are LVT transistors while nchannel DT is an HVT transistor (as indicated by not marking it with an asterisk). The benefits of the mixing of differing threshold voltages may be realized by once again examining the detailed operation of PD0, but by now looking more specifically to the effect on that operation due to the differing threshold voltages. Thus, once again the following discussion first involves the precharge phase of operation and then discusses the evaluate phase of operation.

During the precharge phase of operation, the CLOCK signal is low and, therefore, DT is off while each of the p-channel precharge transistors $PT_0$ through $PT_3$ causes a corresponding precharge node $PN_0$ through $PN_3$ to charge toward the precharge voltage, $V_{DD}$. Depending on the data values of A0 and A1, the remaining n-channel transistors of $PD_0$ may be on or off. Regardless of those transistors, however, note that discharge cannot occur from any of the precharge nodes to ground because DT is off. Note further that DT is an HVT transistor; as a result, because an HVT transistor has a lower leakage current when off (as opposed to an LVT transistor), then the HVT n-channel discharge transistor DT provides a limit to how much current can leak from any of the precharge nodes, through their corresponding discharge paths of the tree structure, to ground. Consequently, even though each discharge path contains some LVT transistors (i.e., the n-channel transistors other than DT), the amount of possible leakage current is limited by the HVT n-channel discharge transistor DT during the precharge phase of operation.

During the evaluate phase of operation, the CLOCK signal is high and the logic function accomplished by PD0 may be realized. In other words, recall that the four outputs of PD0 at the end of the precharge phase each represent a precharged logic state which, in the example of FIG. 2, is a logic low. However, once the evaluate phase begins, the combination of A0 and A1 causes all of the transistors in one of the four discharge paths of the circuit to conduct, and in response the charge at the precharge node of that discharge path discharges to ground and the output connected to the discharged precharge node rise from low to high. During this instance, the three transistors making up the discharge path may be thought of as resistors. Note, therefore, since the two upper transistors of such a path are LVT transistors, the resistance of those transistors is significantly less than the resistance of the HVT transistor DT. Since these three resistances are in series, the overall resistance of the discharge path is reduced as compared to a path which included all HVT transistors. Indeed, note this benefit could be accomplished by having only one of the two upper transistors be an LVT transistor, but by making both of them LVT transistors, the overall series resistance is still lower than if only one were an LVT transistor while the other were an HVT transistor. In any event, because the overall series resistance is reduced, the time needed to discharge the circuit (and, therefore, change the logic state of the corresponding output) is reduced as well.

Given the above configuration, one skilled in the art will readily appreciate that the mixing of transistors with differing threshold voltages provides various benefits. During the precharge phase of operation, the benefit of an HVT transistor in the discharge path is realized in that leakage current is reduced over a circuit having only LVT transistors. Indeed, this leakage should approximate, or be the same as, the leakage of circuits which include only HVT transistors. In opposite fashion, during the evaluate phase of operation, the benefit of one or more LVT transistors in the discharge path is realized in that the speed at which the logic state of the circuit may transition is increased. Moreover, by increasing the speed of operation of PD0, the overall speed of memory configuration 10 is improved as well. Lastly, should the reader desire additional information about the above operation and its benefits, reference is once more made to the above-incorporated U.S. patent application Ser. No. 08/687,800.

Figure 3:
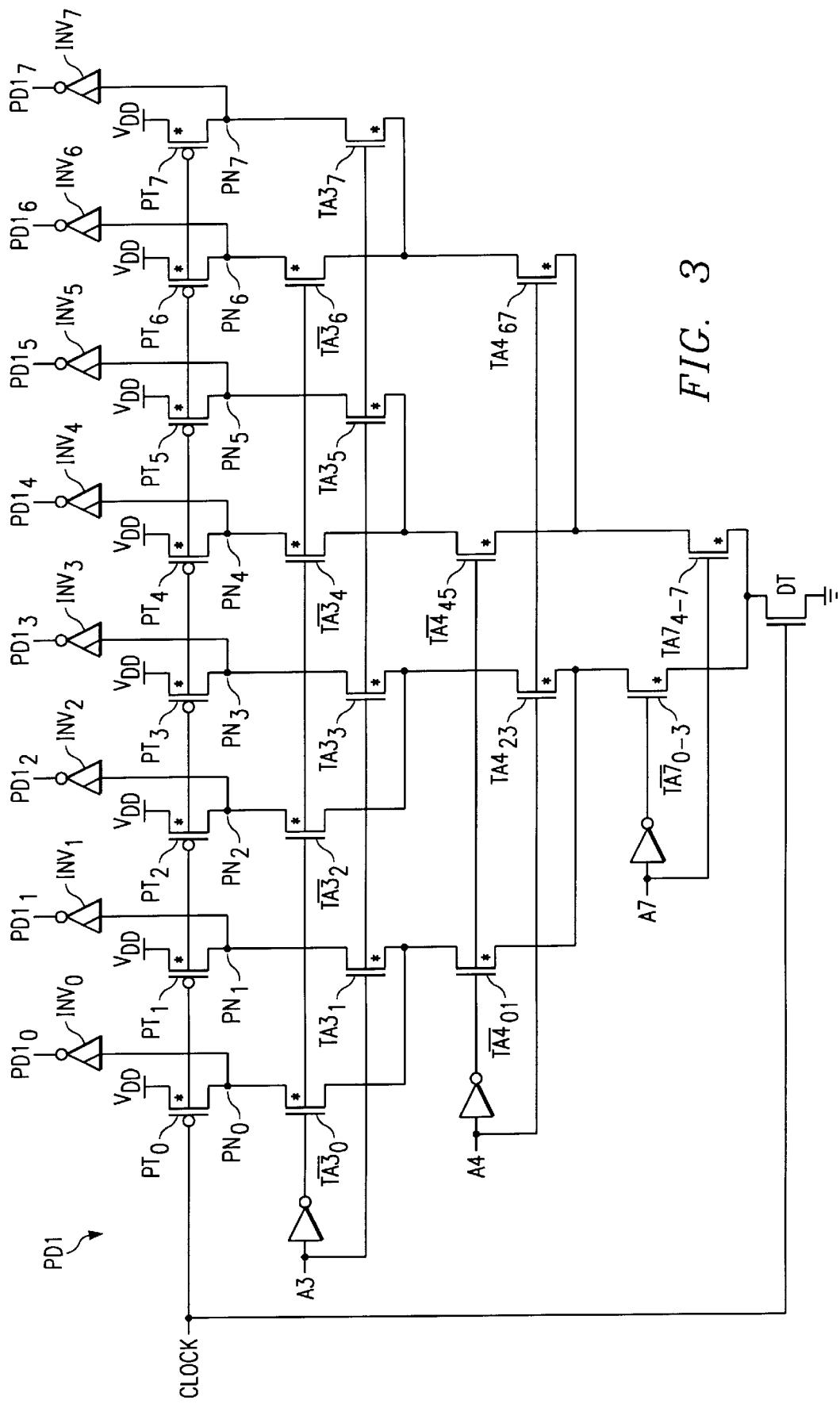
FIG. 3 illustrates a schematic of one of the 3-to-8 predecoders of FIG. 1 (PD1), wherein the predecoder accomplishes its 3-to-8 decoding operation using dynamic logic circuitry.

FIG. 3 illustrates a schematic of the preferred embodiment of predecoder PD1 introduced in FIG. 1, above. Like PD0 of FIG. 2, PD1 in FIG. 3 is also constructed using dynamic logic transistor circuits. Thus, in the preferred embodiment, there are only two differences between PD0 and PD1. First, PD1 is larger than PD0, that is, PD1 is a 3-to-8 circuit whereas PD0 is a 2-to-4 circuit. Second, the inputs and outputs are directed to different connections, namely, PD1 receives address bits A7, A4, and A3, and provides output bits $PD1_0$ through $PD1_7$. Note also that the same labeling format used in FIG. 2 is also carried forward to FIG. 3 and, therefore, one skilled in the art will appreciate the various component designations in FIG. 3 given the earlier discussion of FIG. 2. Additionally, note that once again asterisks are included in FIG. 3 by transistors which are LVT transistors, and those include all the n-channel transistors other than the discharge transistor DT and also includes the p-channel precharge transistors. Lastly, given the two-phase operation of PD1, one skilled in the art may confirm that PD1 generates the value of its output bits $PD1_0$ through $PD1_7$ based on the values shown below in Table 2 for A2, A3, and A4, during the evaluate phase of operation of PD1.

TABLE 2

| A7 | A4 | A3 | $PD1_0$ | $PD1_1$ | $PD1_2$ | $PD1_3$ | $PD1_4$ | $PD1_5$ | $PD1_6$ | $PD1_7$ |
|---|---|---|---|---|---|---|---|---|---|---|
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

Having presented detailed schematics for PD0 in FIG. 2 and PD1 in FIG. 3, note that in one embodiment PD2 also could be constructed in a comparable fashion. Indeed, since PD2 is preferably also a 3-to-8 decoding circuit, it could merely duplicate the circuitry shown in FIG. 3 (while, of course, changing the input bits to A2 through A0). However, in the preferred embodiment, PD2 further implements additional timing considerations with respect to the precharging of nodes in the decoder sets as explained later. Rather than detailing these aspects now in connection with PD2, this discussion is more easily appreciated by first considering the following explanation of the decoder sets as well as the desirability of precharging its nodes.

FIGS. 4a and 4b illustrate a schematic of a simplified embodiment of decoder set 1 of the decoder sets shown in FIG. 1, above, while still additional circuit details for the decoder sets are provided below. As an introductory point, note in the preferred embodiment that each of the decoder sets is configured in the same manner (except for differing inputs and outputs) and, therefore, to simplify the present discussion and Figures only one of the eight decoder sets (i.e., set 1) is shown and discussed in detail. Given this detail, however, one skilled in the art may easily determine the configuration of decoder sets 2 through set 8 of FIG. 1.

Turning to FIGS. 4a and 4b in detail, note that, as shown in FIG. 1, decoder set 1 produces outputs to $WL_0$ through $WL_{31}$; thus, these signals are shown across the top of FIGS. 4a and 4b and each of those outputs connects to a corresponding wordline of storage circuit 12. Therefore, from a layout standpoint, each of the outputs in FIGS. 4a and 4b is approximately the same distance apart as is the wordlines of storage circuit 12. Further, because the wordlines of storage circuit 12 span a total distance of approximately L as introduced earlier, than the span of the outputs to $WL_0$ through $WL_{31}$ shown in FIGS. 4a and 4b is approximately ⅛L. The connections to the thirty-two outputs of decoder set 1 are detailed below, and note as an introductory matter that decoder set 1 is also constructed using a dynamic logic transistor configuration, here having three levels of transistors in each discharge path.

The upper level of decoder set 1 includes four groups of transistors, where each such group includes eight n-channel transistors. Each of these transistors is designated using the convention introduced earlier, that is, by combining the letter "T" with the input signal to the gate of the transistor, and further adding to the subscript the output which is affected by conduction of the transistor. For example, at the far left of FIG. 4a is a transistor which, if conducting, enables $WL_0$, and which receives $PD2_0$ at its input as detailed below; thus, this transistor is identified as $TPD2_{0/0}$. Given the pattern of eight n-channel transistors per group of upper level transistor, note that each transistor has its gate connected to a respective one of signals $PD2_0$ through $PD2_7$. In other words, note that the connection to signals $PD2_0$ through $PD2_7$ repeat for each of these four groups. For example, $PD2_0$ connects to the gate of $TPD2_{0/0}$ in the first group of upper level transistors, to the gate of $TPD2_{0/8}$ in the second group of upper level transistors, to the gate of $TPD2_{0/16}$ in the third group of upper level transistors, and to the gate of $TPD2_{0/24}$ in the fourth group of upper level transistors.

The middle level of decoder set 1 includes four n-channel transistors, again designated by combining the letter "T" with the input signal to the gate of the transistor, and further adding to the subscript the outputs which are affected by conduction of the transistor. For example, at the left of FIG. 4a and connected to the sources of each of the transistors in the first group of upper level transistors, is a transistor which, if conducting, may enables any of $WL_0$ through $WL_7$, and which receives $PD1_0$ at its input; thus, this transistor is identified as $TPD1_{0/0-7}$. Given the connection of $TPD1_{0/0-7}$, one skilled in the art will appreciate the comparable connection to the remaining three transistors in the middle level, namely, $TPD1_{0/8-15}$, $TPD1_{0/16-23}$, and $TPD1_{0/24-31}$.

The lower level of decoder set 1 includes a single n-channel transistor designated $TPD0_{0/0-31}$. Thus, this designation, consistent with the above convention, indicates that the transistor receives $PD0_0$ at its gate, and if conducting may affect the state of any of outputs $WL_0$ through $WL_{31}$. Note also that this lower level, in contrast to the earlier dynamic logic transistor configurations, preferably does not include a docked discharge transistor at the bottom of the configuration. This is because all inputs to decoder set 1 are from other dynamic logic circuits and, therefore, such inputs are disabling during the precharge phase of operation of decoder set 1. Thus, there is no need for an additional discharge transistor in decoder set 1 since the discharge paths of the circuit are otherwise not enabled during the precharge phase of operation.

Given the above-described connections and illustration of decoder set 1 of FIGS. 4a and 4b, note now some of its key aspects. As a first point, in contrast to the earlier dynamic logic transistor configurations, note that decoder set 1 has a different fan out between its levels of n-channel transistors between the upper and middle levels. More particularly, note that the fan out of PD0 and PD1, from the lower to upper level, is from 1, to 2, to 4 transistors. In other words, from the lower level upward, each transistor is connected to only two transistors in the next upper level and thereby presents a fan out ratio of 2:1. In contrast, however, note the increased fan out of PD2. Specifically, from the lower level upward, PD2 has a fan out from 1, to 4, to 32. Thus, the lower level has a fan out such that DT connects to four transistors, while each middle level transistor has a fan out to eight transistors. In other words, the fan out ratios for the lower level to the middle level, and also for the middle level to the top level, are greater than 2:1. This configuration provides various benefits, such as improving loading effects as detailed later. As a second point, one skilled in the art will appreciate from the construction of decoder set 1 how decoder sets 2 through 8 are constructed in a like manner, but to include some of the same inputs, yet certain different inputs, as also introduced earlier in connection with FIG. 1. With respect to using the same inputs, each of decoder sets 2 through 8 provides 32 wordline outputs, and those outputs are connected to four groups of upper level transistors each receiving gate inputs $PD2_0$ through $PD2_7$ in the same manner as decoder set 1. Also, with respect to decoder sets 2 through 4, their middle level transistors gate inputs $PD1_0$ through $PD1_3$ in the same manner as decoder set 1. Also, with respect to decoder set 5, its lower level transistor gate input is $PD0_0$ in the same manner as decoder set 1. With respect to using different inputs, however, in decoder sets 5 through 8, their middle level transistors have their gate inputs connected to $PD1_4$ through $PD1_7$. Lastly, the lower level transistor gate inputs for decoder sets 2 through 4, and 6 through 8 are such that $PD0_1$, is connected to the gate of the lower level transistor in decoder sets 2 and 6, $PD0_2$ is connected to the gate of the lower level transistor in decoder sets 3 and 7, and $PD0_3$ is connected to the gate of the lower level transistor in decoder sets 4 and 8.

Figure 5:
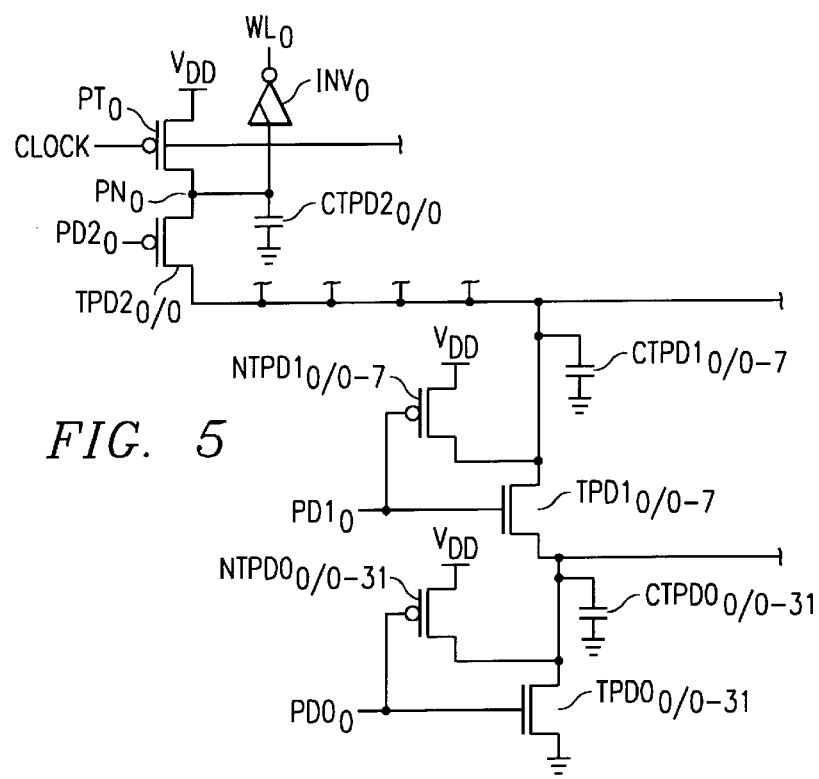
FIG. 5 illustrates a schematic of circuitry used in combination with the decoder sets of the preferred embodiment to reduce the effects of charge sharing.

Recall from the introduction of FIGS. 4a and 4b that it was stated that those Figures illustrate a simplified embodiment; in this regard, FIG. 5 illustrates a first aspect of a more preferred approach to the transistor configuration of the middle and lower level transistors in the decoder sets of FIG. 1. At the outset, note that FIG. 5 illustrates only a portion of decoder set 1 of FIGS. 4a and 4b, with the remainder not shown so as to simplify the Figure as well as the following discussion; however, one skilled in the art will appreciate that the concepts discussed in connection with FIG. 5 are preferably implemented in the remaining comparable portions of decoder set 1, and also in the other decoder sets 2 through 8 as well.

Turning to the details of FIG. 5, note that for each of the n-channel transistors there is also shown a corresponding capacitor connected between the drain of the n-channel transistor and ground. This indication is not intended to illustrate an actual additionally added device, but instead is in recognition that MOS transistors include some level of capacitance due to the nature of how those devices are constructed. This capacitance is known in the transistor art, and is attributed to the transistor gate insulator (or so-called "gate oxide") as well as the source and drain diode capacitance. For reference purposes, note that each of the capacitors is labeled with a designation which combines the letter "C" with the designator for the transistor corresponding to the capacitor. Having introduced these capacitors, note now the preferred embodiment includes additional circuitry to overcome the effects of such capacitors in the construction and operation of a dynamic logic circuit as appreciated by the present inventor. Thus, below is first provided a discussion of the problems caused by such capacitors and is second followed by a discussion of the additional circuitry used to overcome those problems.

As a background to the undesirable effect of the capacitors introduced above, note that each decoder set provides a total of 32 different discharge paths, yet only one of those paths may conduct during a given evaluate phase of operation. However, due to the connection of the PD2 and PD1 outputs to more than one transistor in a decoder set, the discharge paths which do not conduct for a given evaluate cycle also may be affected by capacitive considerations. For example, and ignoring the newly added p-channel transistors of FIG. 5, assume for a given evaluate phase that $PD1_0$ and $PD0_0$ are asserted, thereby connecting the drain of $TPD1_{0/0-7}$ to ground and discharging the charge on $CTPD1_{0/0-7}$. During the successive precharge phase, precharge node $PN_0$ in FIG. 5 is precharged. As a result, a charge of $V_{DD}$ is stored on capacitor $CTPD2_{0/0}$. Assume in the subsequent evaluate phase, that $PD2_0$ is asserted while $PD1_0$ is not asserted. Consequently, when $TPD2_{0/0}$ conducts (in response to the assertion of $PD2_0$), some of the charge from $CTPD2_{0/0}$ will pass to capacitor $CTPD1_{0/0-7}$. In other words, the capacitors are therefore "sharing" charge and, thus, this aspect is known as "charge sharing" in the art. Since some of the charge may be depleted from $CTPD2_{0/0}$, there is the possibility that the output from inverter $INV_0$ will rise, or that some other undesirable response may occur.

Still further aspects of the present embodiment are further recognized by the present inventor as giving rise to the need to consider the effects of charge sharing. For example, in a dynamic logic circuit with only two transistors per discharge path, or perhaps including relatively small transistors (with transistor sizing in the present embodiments discussed later), the effects of charge sharing may be considered negligible and, therefore, not warranting additional circuitry to counteract such effects. However, since the decoders sets of the present embodiment include discharge paths with at least three transistors each, then the capacitive effect of a third transistor warrants attention to the possible charge sharing effects. Moreover, as another and possibly cumulative example, in a tightly configured dynamic logic circuit, the effects of charge sharing also may be considered minimal. However, from FIGS. 4a and 4b, recall that each of the outputs for a decoder set are spaced apart at a distance which is essentially defined by the pitch spacing of the wordlines of storage circuit 12. Therefore, this spacing necessitates a noteworthy amount of conductor length between each n-channel transistor in the upper portion of the decoder set; consequently, this increased conductor length imposes additional capacitance on the circuit which may further increase the capacitance effects described above.

Having noted some of the problematic effects of the additional capacitance in the embodiment of FIGS. 4a and 4b, note now a solution as introduced in FIG. 5. Specifically, note that each n-channel transistor in FIG. 5, other than the upper level n-channel transistors (i.e., those with their drains connected directly to a precharge node), is connected to an additional p-channel node pull-up transistor abbreviated "NP", and further designated by combining the NP indicator with the identifier for the corresponding n-channel transistor. More specifically, for each such n-channel transistor, its drain is connected to the drain of the corresponding NP, and its gate is connected to the gate of the corresponding NP. The source of each NP is connected to $V_{DD}$. Thus, the NP operates as described below, and assists to minimize the effect of charge sharing.

In operation, each NP pulls up the source node of a corresponding n-channel transistor and, in doing so, thereby charges the capacitance of the node to $V_{DD}$. For example, consider n-channel transistor $TPD1_{0/0-7}$ and its corresponding NP transistor $NPTPD1_{0/0-7}$. During the precharge phase of operation, it is known that the input signal, $PD1_0$, to the gates of both transistors will be low. Recall that this is known because that input signal is also from a dynamic logic circuit (here, predecoder PD1) and, therefore, by definition the signal is not enabling to the discharge path during the precharge phase of operation. This low signal causes $NPTPD1_{0/0-7}$ to conduct, thereby charging capacitor $CTPD1_{0/0-7}$ to $V_{DD}$. Note further, therefore, that this precharge eliminates the possible effect of charge sharing. In particular, if in the subsequent evaluate phase transistor $TPD2_{0/0}$ conducts, then no charge is shared between $CTPD2_{0/0}$ and $CTPD1_{0/0-7}$ because the voltage at both is the same. Lastly, note two additional observations regarding the use of additional node pull-up transistors as just described. First, as mentioned above and although not expressly shown so as to simplify the present illustration and discussion, in the preferred embodiment each of the n-channel transistors in all of the decoder sets (other than those n-channel transistors in the upper levels of those sets) have a corresponding node pull-up transistor connected to them in the manner just described. Second, note that as an alternative, the gate of each of the node pull-up transistors could be connected to the CLOCK signal to achieve the same pull-up effect; however, such an approach may well be undesirable due to the extensive additional conductors which would be required to connect to the CLOCK signal.

Figure 6:
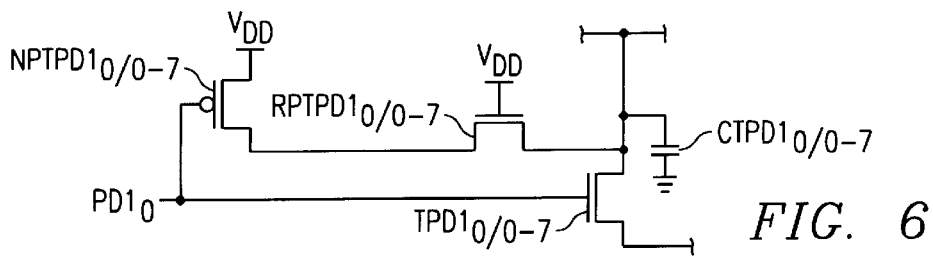
FIG. 6 illustrates a schematic of circuitry used in combination with the circuitry of FIG. 5 to increase the speed of performance by requiring a precharge voltage of less than $V_{DD}$.

Having noted the solution of FIG. 5 to the problematic effects of the additional capacitance in the embodiment of FIGS. 4a and 4b, FIG. 6 illustrates yet an additional aspect of the preferred embodiment for each of the decoder sets. Before proceeding, note that the aspect of FIG. 6 is also repeated for each n-channel transistor which is connected to a corresponding NP shown above. Thus, to simplify the Figure and the following discussion, only a single NP is shown, but it is to be understood by one skilled in the art that the concept of FIG. 6 is preferably implemented with respect to each of the NPs used in the decoder sets of the present embodiment.

Turning to FIG. 6, it illustrates by way of example n-channel transistor $TPD1_{0/0-7}$ which is shown in FIGS. 4a, 4b, and 5. From FIG. 5, it was noted that $TPD1_0$ is preferably connected to a node pull-up transistor as well. However, the present inventor has further recognized still an additional consideration which further improves circuit speed. Particularly, recall from the discussion of FIG. 5 that each NP in that Figure operates to pull up the corresponding capacitor to a voltage of $V_{DD}$. However, the present inventor has further recognized that such a level of pull-up voltage may be more than is necessary. Specifically, returning to the earlier introductory discussion of charge sharing and FIG. 5, recall the example where charge is shared by capacitors CFPD2$_{0/0}$ and CTPD1$_{0/0-7}$ because of the conduction of TPD2$_{0/0}$. The present inventor has further recognized, however, that in this event, the largest voltage which may be achieved at CTPD1$_{0/0-7}$ is actually V$_{DD}$ minus the threshold voltage (i.e., V$_T$) of TPD2$_{0/0}$. In other words, it is known in the transistor art that an n-channel transistor connected in a configuration as is TPD2$_{0/0}$ will drop one threshold voltage across it. Thus, the largest voltage which may result at CTPD1$_{0/0-7}$ due to charge sharing is actually V$_{DD}$-V$_T$. Recognizing this, the present inventor has further improved the preferred embodiment by having each NP pull up its corresponding node only to V$_{DD}$-V$_T$, rather than requiring the additional power and time which would be required to pull up that node to V$_{DD}$. To accomplish this operation, note that the embodiment of FIG. 6 further includes a reduce precharge transistor, labeled "RP", and combining the RP abbreviation with the identifier of the corresponding n-channel transistor to which it is connected (which is TPD1$_{0/0-7}$ in the example of FIG. 6). With respect to its connections, RPTPD1$_{0/0-7}$ has its drain connected to the drain of NPTPD1$_{0/0-7}$, its gate connected to V$_{DD}$, and its source connected to the drain of TPD1$_{0/0-7}$. Thus, one skilled in the art will appreciate that once the input signal PD1$_0$ is low, the node pull-up transistor NPTPD1$_{0/0-7}$ conducts a voltage of V$_{DD}$ to RPTPD1$_{0/0-7}$, but then a V$_T$ is lost across the latter. Therefore, a precharge voltage of V$_{DD}$-V$_T$ is applied to CTPD1$_{0/0-7}$. Once again, this same configuration and result is preferably achieved with the remaining pulled-up n-channel transistors of the middle and lower levels of each of the decoder sets 1 through 8 in FIGS. 4a and 4b.

Turning now to yet another aspect to be added to the embodiment of the decoder sets as shown in FIGS. 4a and 4b, note that the 32 precharge transistors of those Figures (i.e., PT$_0$ through PT$_{31}$) are all shown as having their gates connected to a common CLOCK signal. Because the precharge transistors of FIGS. 4a and 4b are only those for one decoder set, this same concept applies also to the remaining seven decoder sets, thereby having the same common CLOCK signal connected to the gates of a total of 256 precharge transistors. However, the present inventor has recognized that such an approach may be undesirable for various reasons. For example, for 256 p-channel transistors, the capacitive load to the CLOCK signal connected in this manner would be the capacitance of each conducting transistor. Thus, if each such transistor is 15 microns wide, then a total capacitance of 3,840 microns (i.e., 256*15) would be imposed on the CLOCK signal, as well as any conductor length also used in presenting that signal to the precharge transistors. Accordingly, as an alternative to using the CLOCK signal in this manner, a different approach is shown below in FIG. 7 whereby PD2 is used, in addition to providing a set of data signals for discharging n-channel transistors in the decoder sets, also to generate a set of precharge signals for connecting to the gates of precharge transistors in the decoder sets in lieu of the CLOCK signal as shown in FIGS. 4a and 4b.

Figure 7:
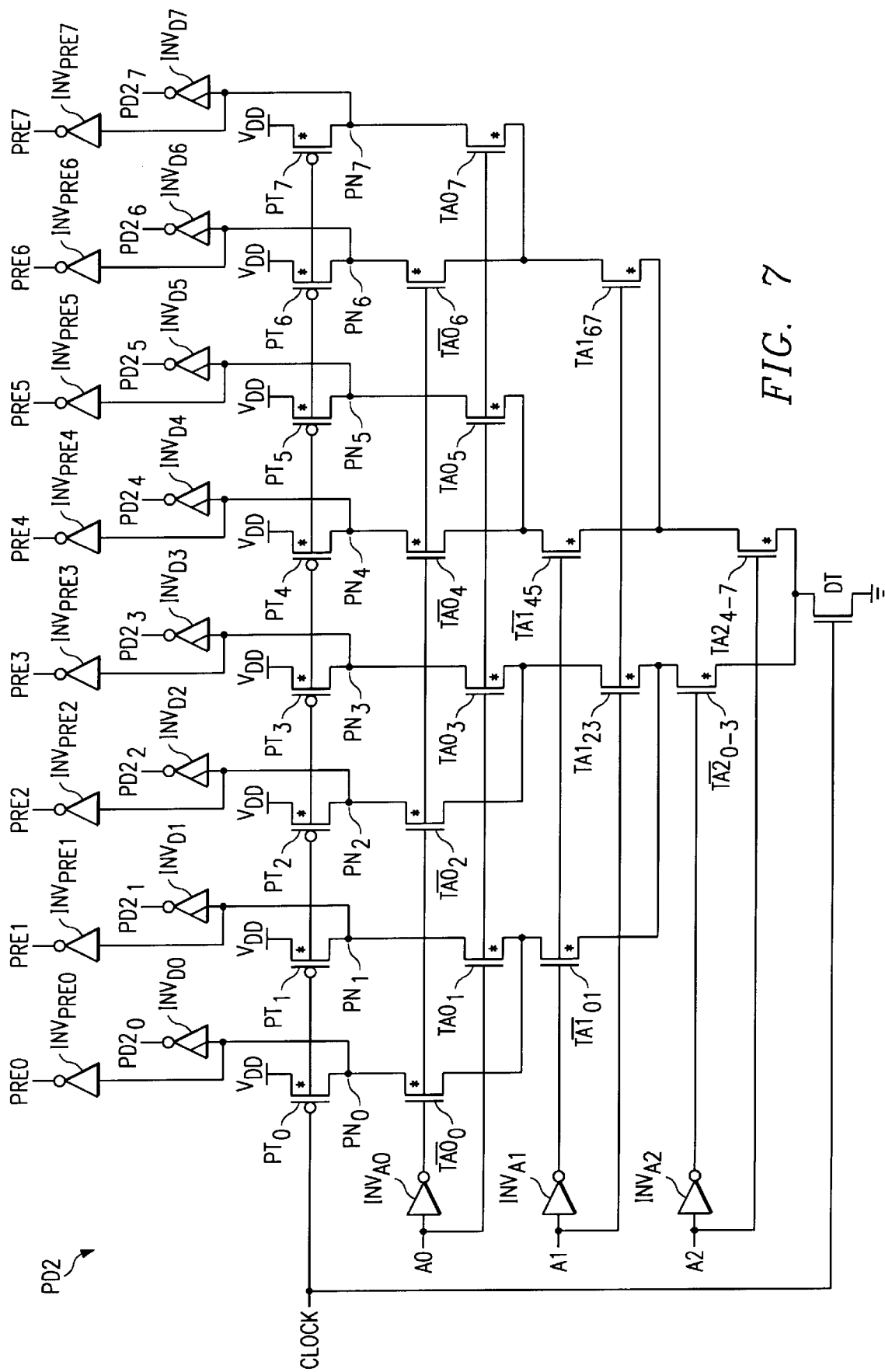
FIG. 7 illustrates a schematic of a simplified embodiment of another of the 3-to-8 predecoders of FIG. 1 (PD2) using dynamic logic circuitry, where each precharge node provides two outputs via a pair of inverters, where a first inverter of a pair of inverters outputs a data signal to conditionally discharge a corresponding precharge node in a decoder set and where a second inverter of the pair of inverters outputs a signal to conditionally precharge the corresponding precharge node in the decoder set.

FIG. 7 illustrates a schematic of a first embodiment of PD2, which as appreciated below includes the preferred circuitry for generating data signals (i.e., PD2$_0$ through PD2$_7$) but which provides an introduction to a more preferred embodiment for PD2 described later with respect to producing precharge signals (i.e., PRE0 through PRE7) to be connected to the pchannel precharge transistors of the decoder sets. Looking briefly to FIG. 7, note that PD2 is constructed in the same general dynamic logic configuration as is PD1 of FIG. 3. Thus, the reader is referred to the earlier discussion of FIG. 3 to appreciate the common details with respect to FIG. 7. Briefly reviewing certain aspects, note that PD2 includes three levels of n-channel transistors corresponding to a total of three inputs (i.e., address bits A0, A1, and A2), and provides a total of eight possible discharge paths such that a corresponding precharge node for any one of those paths is discharged in a given evaluate phase, and the signal on that discharged node is inverted to provide a high output signal on one of eight PD2 outputs which are hereafter referred to as data signals and are shown as PD2$_0$ through PD2$_7$.

Given the functionality of data signals PD2$_0$ through PD2$_7$ which are connected to the decoder sets as shown in FIGS. 4a and 4b, note that the present inventor has recognized various considerations for providing an efficient selection of the transistor sizes of the inverters INV$_{D0}$ through INV$_{D7}$ which provide these data signals. At the outset, note that each of inverters INV$_{D0}$ through INV$_{D7}$ includes a p-channel transistor and an n-channel transistor connected to provide an inverting function as known in the art (i.e., gates of the transistors connected to form an input, drains of the transistors connected to form an output, and the source of each connected to differing potentials). However, with respect to the size of the p-channel transistors in these inverters, the present inventor has observed that the necessary drive signal is considerably lower than what may be otherwise perceived as needed by one skilled in the art, as appreciated from the following discussion.

Each data signal PD2$_0$ through PD2$_7$ is connected to drive the gates of 32 n channel transistors in the eight decoder sets (i.e., 4 n-channel transistors per decoder set *8 decoder sets=32 transistors). Thus, at first review, one skilled in the art may well be inclined to size the inverter p-channel transistor so that it may source enough current to drive 32 transistors to a conductive state. In other words, in such an approach, one skilled in the art would determine the capacitive load provided by the gates of 32 conducting transistors, and then size the inverter p-channel transistor to source enough current for those transistors. However, under the preferred embodiment, note that the above-described fan out of each decoder set is such that in a given evaluate phase of operation, when one of the data signals PD2$_0$ through PD2$_7$ is asserted, then only one of the 32 driven transistors will be in a path which conducts and discharges its precharge node during that phase. In other words, only one of those paths is such that the other series-connected transistors in that path are also enabled. Therefore, the 31 transistors in the other paths, while receiving an asserted data signal at their gates (i.e., from PD2), will not conduct because their sources will not be at a relatively low voltage to cause conduction of each of those transistors (i.e., V$_{GS}$ for those transistors will be approximately zero rather than above the threshold voltage for the transistor as is required for conduction). Having recognized this aspect, the present inventor further notes that the gate capacitance for a non-conducting (or "non-enabled") transistor ("C$_{NC}$") is considerably less than the gate capacitance when the transistor conducts ("C$_C$")(i.e., when the transistor is "enabled"). As an approximation and only by way of example, the non-conducting transistor may provide roughly 0.3 of the capacitance of the conducting transistor, that is, C$_{NC}$≈0.3C$_C$. Consequently, when determining the total capacitance to be driven by one of the data signals PD2$_0$ through PD2$_7$, and rather than driving a capacitance of 32 *C$_C$ the present inventor has sized the inverter p-channel transistors to drive a capacitance of 1*C$_C$+31*C$_{NC}$. Substituting for the latter the fact that C$_{NC}$ equals roughly $0.3C_C$, then the present inventor has sized the inverter p-channel transistors to drive a capacitance of $1*C_C+31*(0.3C_C)=10.3C_C$. As stated earlier, without recognizing this aspect, one skilled in the art may have merely sized the dimensions (i.e., transistor width/length) of the inverter p-channel transistors to drive a capacitance for 32 transistors, thereby resulting in a value of $32C_C$. Thus, under the preferred embodiment, this capacitance, and the size of the transistors to drive it, is reduced by a factor of three (i.e., $32/10.3 \approx 3$). Given these considerations, for a n-channel transistor size of 30 microns for the TPD2 transistors of the decoder sets, then the PD2 inverter p-channel transistors are sized on the order of 70 microns. This sizing, however, is further refined based on conductor capacitance as described below.

In addition to transistor gate capacitance, the present inventor has further considered the conductor capacitance involved when evaluating the preferred size (and hence current drive capability) for the p-channel transistors of inverters $INV_{D0}$ through $INV_{D7}$ of PD2. More particularly, recall from FIG. 1, and also from FIGS. 4a and 4b, that the layout of the preferred embodiment gives rise to considerable spans of conductors. Indeed, it has been observed in the preferred embodiment that due to this length, the additional capacitance provided by the conductors between PD2 and the decoder sets is roughly the same as provided by the combination of the single conducting and 31 non-conducting n-channel transistors. In other words, the capacitance contributed by the conductors doubles the total capacitance expected to be incurred by each inverter p-channel transistor and, therefore, the total capacitance may be on the order of $20.6C_C$. This total amount is still approximately one-half of the drive capability of $32C_C$ (for the transistors) plus $10.3C_C$ (for the conductor) which might otherwise be assumed as necessary by one skilled in the art, and thus in any event one skilled in the art should now appreciate that the preferred embodiment may be achieved by sizing each PD2 inverter p-channel transistor to provide at most ¾ of the drive current as would be required if all of the decoder set transistors were conducting (i.e., the preferred drive capability is less than or equal to ¾ times $32C_C$). Consequently, in the preferred embodiment and considering both transistor gate capacitance as well as conductor capacitance, for a n-channel transistor size of 30 microns for the TPD2 transistors of the decoder sets, then the PD2 inverter p-channel transistors are sized on the order of 140 microns.

Turning now to the precharge signals provided by PD2, recall it is introduced above that, in addition to providing data signals $PD2_0$ through $PD2_7$ which are connected to the decoder sets as shown in FIGS. 4a and 4b, PD2 also preferably provides a corresponding set of precharge signals which likewise are used to operate the precharge phase of operation of the decoder sets. More specifically, note that each precharge node of PD2 is connected to the inputs of two inverters. The first inverter is of the type described above and provides a data signal, such as $PD2_0$ through $PD2_7$. These inverters are shown as $INV_{D0}$ through $INV_{D7}$. Each second inverter provides a precharge signal Thus, these inverters are shown as $INV_{PRE0}$ through $INV_{PRE7}$. The precharge signal from a given second inverter is associated with the data signal from the first inverter which is driven by the same precharge node in the following manner. First, for a given pair of inverters, the data signal is used in the manner shown in FIGS. 4a and 4b, that is, to drive the gates of 32 n-channel transistors, where each of those n-channel transistors is in a different group of transistors in one of eight decoder sets. Second, for that same pair of inverters, the precharge signal is connected to the gates of 32 precharge transistors in the decoder sets, where those precharge transistors correspond to the same discharge paths which include the transistors receiving the data signal from the first inverter. For example in FIG. 7, note that precharge node $PN_0$ is connected to the input of an inverter $INV_{D0}$ as well as to the input of an inverter $INV_{PRE0}$. The output of $INV_{D0}$ thus provides the data output signal $PD2_0$ while the output of an $INV_{PRE0}$ provides the precharge signal PRE0. Returning briefly to FIG. 4a, therefore, it is intended that $PD2_0$ from $INV_{D0}$ is to connect to the gate of n-channel transistor $TPD2_{0/0}$ while PRE0 is intended to connect to the gate of the corresponding precharge transistor in the same discharge path, namely, $PT_0$. Similarly, therefore, $PD2_0$ also connects to the gates of three other transistors in decoder set 1, namely, $TPD2_{0/8}$, $TPD2_{0/16}$, and $TPD2_{0/24}$. PRE0 likewise connects to the corresponding precharge transistors $PT_8$, $PT_{16}$, and $PT_{24}$. Given this example, recall further that $PD2_0$ through $PD2_7$ connect to decoder sets 2 through 7 in a manner comparable to the connections of those signals to decoder set 1; that is, $PD2_0$ through $PD2_7$ connect to the gates of respective transistors in each group of eight transistors in the upper level of the decoder sets. Likewise, therefore, PRE0 through PRE7 connect to the corresponding p-channel pull-up transistors in those sets; thus, PRE0 through PRE7 connect to the gates of respective pull-up transistors in each group of eight transistors in the upper level of the decoder sets. Thus, one skilled in the art will appreciate the remaining comparable connections between data and precharge outputs of PD2 to the corresponding n-channel and precharge transistors, respectively, of the decoder sets.

Figure 8:
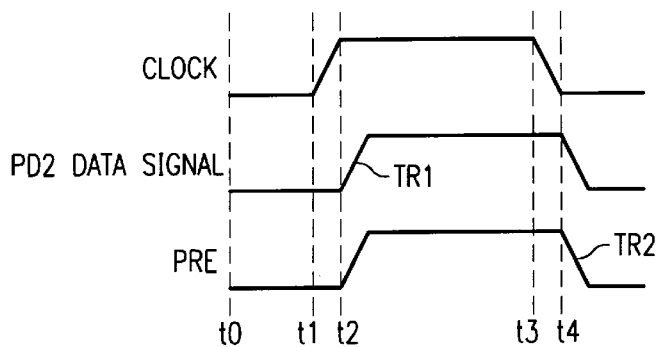
FIG. 8 illustrates a timing diagram of one of the pairs of output signals from FIG. 7, wherein the transitions of the data signal PD2 and the precharge signal PRE generally coincide with one another since the PD2 data signal and the PRE signal are produced by inverters having inputs connected to the same precharge node.

Given the above-description of PD2 of FIG. 7, note in a given evaluate phase that only one of the eight PD2 precharge nodes transitions, and thus only one of $PD2_0$ through $PD2_7$ and a corresponding one of PRE0 through PRE7 transitions in response. To further illustrate this as well as some additional considerations, FIG. 8 illustrates a timing diagram of the data signal and precharge signal described immediately above in connection with FIG. 7. The top signal in FIG. 8 represents the CLOCK signal of FIG. 7. The middle signal in FIG. 8 represents the one of eight data signals which transitions during the evaluate phase of operation. Similarly, the bottom signal in FIG. 8 illustrates the precharge signal output which transitions during the evaluate phase of operation. To facilitate the following discussion, assume by way of example therefore that the middle signal of FIG. 8 is the $PD2_0$ signal, and thus the bottom signal in FIG. 8 is the PRE0 signal. Lastly, note that FIG. 8 does not purport to precisely demonstrate the exact delays between signal transitions but, instead, merely demonstrates in general the succession of events following transitions in the CLOCK signal.

Looking now more specifically to the transitions and effects of FIG. 8, at t0 the circuits are shown at a steady-state of operation which, as appreciated from the following discussion, is occurring when PD2 is in its precharge phase of operation. Specifically, at t0, the CLOCK signal input to the gates of the p-channel precharge transistors of PD2 is low; thus, each of those transistors is enabled and precharge nodes $PN_0$ through $PN_7$ are precharged to $V_{DD}$. Consequently, the output of all inverters $INV_{D0}$ through $INV_{D7}$, and the output of all of inverters $INV_{PRE0}$ through $INV_{PRE7}$, are low. Thus, both $PD2_0$ and PRE0 are low at t0, as shown in FIG. 8.

At t1, the CLOCK signal transitions from low to high. Looking to FIG. 7, this transition causes each precharge transistor to begin to shut off while simultaneously causing discharge transistor DT to begin to turn on. Thus, after some delay, at a time t2 one of the discharge paths in PD2 is completed and a data signal from PD2 begins to transition from low to high, as shown by the middle signal in FIG. 8. For purposes of later discussion, this transition is labeled as transition TR1 in FIG. 8. Also at t2, the output of the precharge signal corresponding to the data signal which is transitioning will likewise begin to transition from high to low, as shown by the PRE signal in the bottom of FIG. 8.

At t3, the CLOCK signal transitions from high to low. Returning to FIG. 7, this transition causes each precharge transistor to begin to turn on while simultaneously causing discharge transistor DT to begin to turn off. Thus, after some delay, at a time t4, the one data signal among $PD2_0$ through $PD2_7$ which had transitioned from low to high (e.g., $PD2_0$ in FIG. 8) will now reverse its course, that is, it transitions from high to low. For purposes of later discussion, this transition is labeled as transition TR2 in FIG. 8. Lastly, also starting at t4, the output of the precharge signal corresponding to the data signal which is transitioning will likewise begin to transition from high to low, as shown by the PRE signal in the bottom of FIG. 8.

Note that TR1 represents the event which immediately causes one of the decoder sets to select the appropriate wordline being addressed. In other words, TR1 is connected as an enabling signal to the decoder sets and, thus, its transition in turn enables a discharge path in one of the decoder sets to thereby address the wordline. In this regard, the time it takes for TR1 to rise following t2 is sufficiently critical, that is, it is desirable to make this transition as quick as reasonably possible to facilitate addressing the wordline. Consequently, this faster transition may be achieved by increasing the size of the p-channel transistor used to construct each inverter providing a data for PD2 (i.e., each of $INV_{D0}$ through $INV_{D7}$). In contrast, however, note that the rising speed of the transition of the PRE signal which is also occurring at t2 is not as critical and, therefore, it may be designed to be slower. Similarly, therefore, a relatively slower transition speed may be achieved by decreasing the size of the p-channel transistor used to construct each inverter $INV_{PRE0}$ through $INV_{PRE7}$ in FIG. 7.

Note further that considerations opposite those of the preceding paragraph arise with respect to TR2. More specifically, note that TR2 represents the event which immediately causes the precharging of the decoder set nodes which were discharged in the immediate preceding cycle due to TR1. In other words, TR2 is connected as an enabling signal to the precharge transistor of the decoder sets and, thus, its transition in turn enables the precharge phase in the one of the decoder sets which was discharged by the immediately preceding action of TR1. Thus, in this regard the time it takes for TR2 to fall following t4 is sufficiently critical, that is, it is desirable to make this transition as quick as reasonably possible to facilitate the next precharge phase. Consequently, this faster transition may be achieved by increasing the size of the n-channel transistor used to construct each inverter $INV_{PRE0}$ through $INV_{PRE7}$ in FIG. 7. In contrast, however, note that the falling speed of the transition of the PD2 signal which is also occurring at t4 is not as critical and, therefore, it may be designed to be slower. Similarly, therefore, a relatively slower transition speed may be achieved by decreasing the size of the n-channel transistor used to construct each of $INV_{D0}$ through $INV_{D7}$.

Given the above, it may now be appreciated by one skilled in the art that the dual-inverter configuration used at each precharge node of PD2 in FIG. 7 may be implemented to achieve various desirable timing considerations. Note further that the complementary action of the signals, which as shown above also gives rise to a desire to construct complementary-sized inverters (i.e., with respect to the transistors used to construct those inverters), arises because both inverters necessarily share the same input In other words, since the input of each of the paired inverters is connected to a common precharge node, then the complementary signals and construction is required. To avoid this result, below is provided an alternative embodiment of PD2 which does not use the same common node to drive the data and precharge signal outputs of PD2 and, thus, does not give rise to the common transitions shown in FIG. 8.

Figure 9:
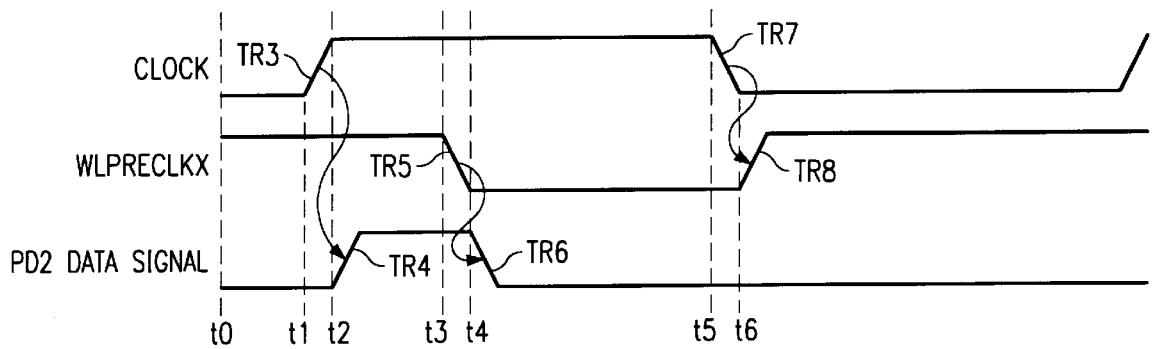
FIG. 9 illustrates a timing diagram of an alternatively produced PD2 data signal, wherein the transitions of the PD2 data signal are controlled in a manner which do not coincide with the transitions of a precharge signal PCHG shown in FIG. 11.

As further background to the alternative embodiment of PD2 introduced immediately above, FIG. 9 illustrates a timing diagram of three signals related to that embodiment, while the actual circuit is detailed below in connection with FIG. 10. Before proceeding, note two initial observations. First, note that FIG. 9 does not precisely demonstrate the exact delays between signal transitions but, instead, demonstrates the general succession of events following transitions in the CLOCK signal. Second, note that the FIG. 9 signals assume that in contrast to the approach of FIGS. 7 and 8, for FIG. 9 the same precharge node is not used to drive both the transition of the PD2 data signal and the transition of the corresponding precharge signal (the latter of which is shown below in FIG. 11). Turning then to FIG. 9, its top signal again represents the CLOCK signal used with PD2, and its bottom signal illustrates the one of eight outputs of PD2 which transitions during the evaluate phase of operation. The middle signal of FIG. 9 represents a signal which is generally known in the art to be included within a memory decoder circuit, and which in the present instance is identified as WLPRECLKX. Note that the name for this signal is chosen to suggest that the signal relates to the wordline operation of the memory (hence, the "WL"), and more particularly relates to the precharge clocking (hence, the "PRECLK"). Lastly, the signal is an active low signal and, therefore, includes an "X" at the end of the signal name. The details of generating the WLPRECLKX signal are described later. At this point, however, it is sufficient with respect to WLPRECLKX to note that it is asserted (i.e., active low) at a time when the predecoders (i.e., PD0 through PD2) have evaluated and the wordline has had sufficient time to turn on in response to the evaluation by those predecoders.

Having introduced the three signals of FIG. 9, it is now instructive to examine the relationship of the transitions of those signals, and later it is shown how those relationships are embodied in a circuit configuration. To facilitate this discussion, note that various signal transitions are labeled in FIG. 9 by combining the abbreviation "TR" with an integer number so that the signal transition may be readily identified in the following discussion.

At a time t0, assume the circuit configuration giving rise to the FIG. 9 signals is at some steady-state which, as appreciated from the following discussion, is occurring when PD2 is in its precharge phase of operation. Thus, at t0, CLOCK is low, WLPRECLKX is high (i.e., unasserted), and the PD2 data signal is low (i.e., no output of PD2 is asserted). At a time t1, the CLOCK signal has a transition TR3 from low to high, and note for reasons more clear below that WLPRECLKX continues to be high at this time (i.e., at t1). At a time t2, the PD2 data signal has a transition TR4 which in part is caused by transition TR3 of the CLOCK signal. In other words, as of t2, PD2 begins its evaluate phase and one of its outputs rises from low to high.

Moreover, because of the causal relationship between TR3 and TR4, note that an arrow is shown generally from TR3 to TR4. This same arrow convention is used for the remainder of this document to illustrate additional causal relationships between signal transitions.

At a time t3, WLPRECLKX is asserted active low, as shown by its transition TR5. Recall from earlier that this event indicates that PD0 through PD2 have evaluated and the wordline has had sufficient time to turn on. The present inventor has therefore appreciated that there is then no reason to further maintain the asserted data signal of PD2 for the given cycle. In other words, if the wordline is turned on, the asserted output from PD2 has served its purpose. Consequently, TR5 of WLPRECLKX is used to cause a transition in the PD2 data signal, as is shown by the relationship of TR5 causing TR6 at a time t4. Thus, at t4, the PD2 data signal begins its transition from high to low and during that transition will reach a level no longer enabling to the transistor to which it is connected in the decoder sets.

Lastly in FIG. 9, at a time t5 the CLOCK signal has a transition TR7 from high to low, as is common in the art. Moreover, also as known in the art, this signal is then used to de-assert WLPRECLKX. Thus, at t6, WLPRECLKX is shown to have a transition TR8 which, by the arrow convention introduced earlier, is shown to be caused by the transition TR7 of the CLOCK signal.

Given the signals of FIG. 9, and more particularly the relationship between the various signal transitions, it is now instructive to observe how these signals may achieved using a circuit embodiment In this regard, note that the PD2 data signal transitions high at TR4 only when both the CLOCK signal and the WLPRECLKX signals are high, and further that the PD2 data signal transitions low at TR6 when one of either the CLOCK signal and the WLPRECLKX signal transitions low. Thus, given these observations, one skilled in the art will appreciate that such a result may be reached using an embodiment which includes a logical AND of the CLOCK signal and the WLPRECLKX signal, where the output of that AND operation is connected to the gates of the PD2 precharge transistors and to the gate of the PD2 discharge transistor; in this approach, therefore, when the output of the AND operation is low, PD2 is in its precharge phase of operation while when that output is high, PD2 is in its evaluate phase of operation. As detailed below in connection with FIG. 10, however, the preferred embodiment of implementing a comparable result is achieved in yet another alternative configuration.

Figure 10:
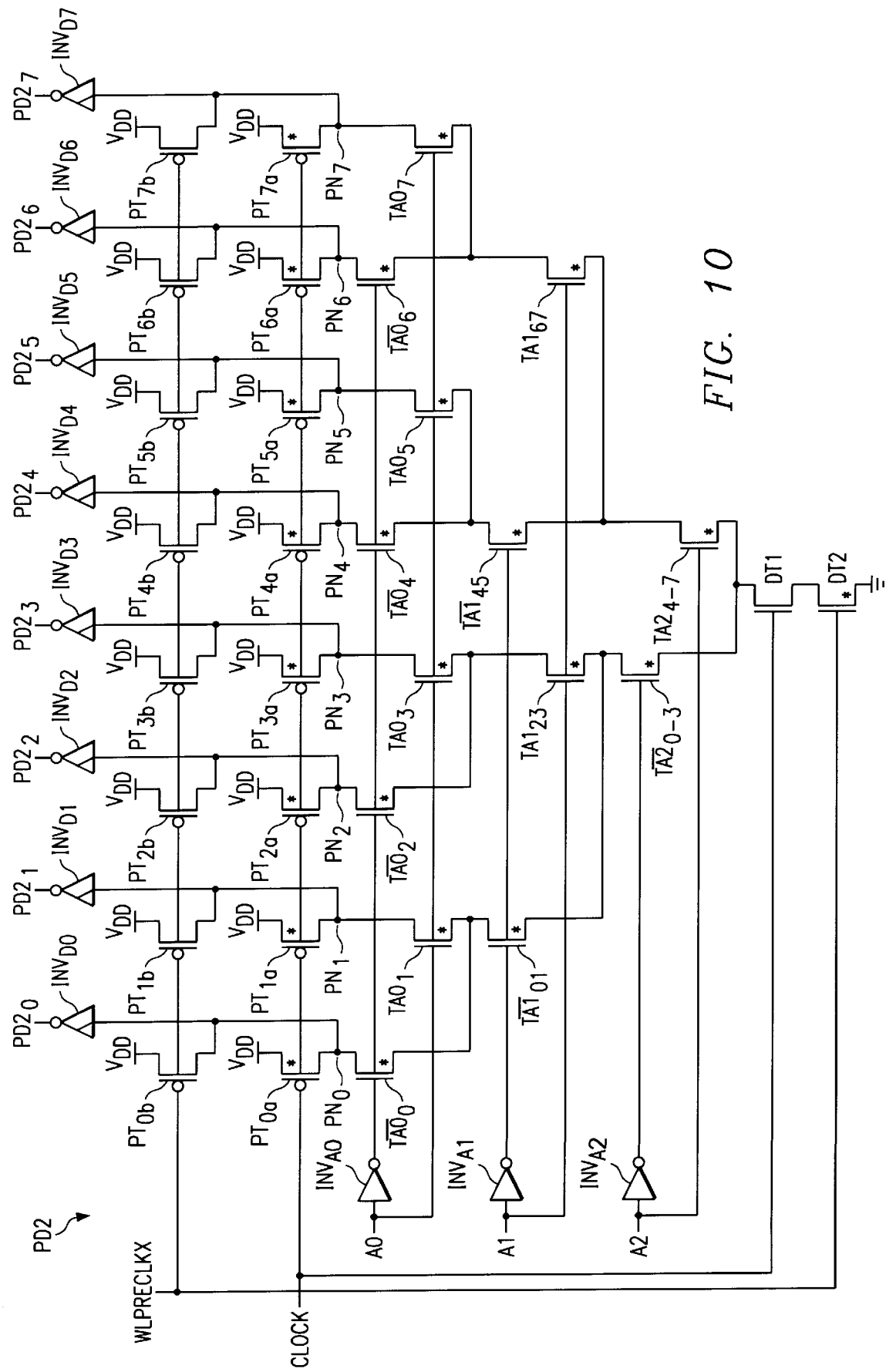
FIG. 10 illustrates a partial schematic of PD2 including circuitry for providing the timing signals shown in FIG. 9.

FIG. 10 illustrates a schematic of the preferred embodiment of circuitry included within PD2, and includes circuitry for accomplishing the timing operation discussed above with respect to FIG. 9. Generally, PD2 of FIG. 10 includes many of the same components of PD2 of FIG. 7 and, therefore, like reference numerals are mostly carried forward from FIG. 7 to FIG. 10. Moreover, the reader is assumed familiar with the earlier discussion of FIG. 7 and, thus, many of the details earlier stated are not re-stated here. Instead, the following discussion focuses on the additional circuitry of PD2 of FIG. 10. Lastly, the differences in PD2 of FIG. 7 and PD2 of FIG. 10 are best understood by looking to the circuitry responsible for both the precharge and evaluate phases of operation. Thus, each of these circuits is discussed below.

With respect to the circuitry related to the precharge phase of operation of PD2 in FIG. 10, like PD2 of FIG. 7, each data signal $PD2_0$ through $PD2_7$ of PD2 is provided by a corresponding inverter $INV_{D0}$ through $INV_{D7}$. Also like PD2 of FIG. 7, each of the inputs of those inverters are connected to respective precharge nodes $PN_0$ through $PN_7$. As an addition, however, note that each precharge node of PD2 of FIG. 10 is connected to the drains of two p-channel precharge transistors rather than a single precharge transistor (as in FIG. 7). These precharge transistors, by definition, have their source connected to a voltage reference $V_{DD}$. To establish a convention, the transistors in these pairs are designated by combining the legend "PT" with a subscript having the same number as the number of the output affected by the precharge transistor, and further having either an "a" or a "b" based on the gate input to the precharge transistor. More specifically, those precharge transistors having the CLOCK signal at their inputs combine the letter "a" in their subscripts with the number corresponding to the output, while those precharge transistors having the WLPRECLKX signal at their inputs combine the letter "b" in their subscripts with the number corresponding to the output In the preferred embodiment, the precharge transistors having their gates connected to the CLOCK signal are substantially smaller in width than the width of the precharge transistors having their gates connected to the WLPRECLKX signal; for example, the factor may be on the order of 45 or so. Indeed, in the present embodiment, the precharge transistors having their gates connected to the CLOCK signal are 0.65 microns wide while the precharge transistors having their gates connected to the WLPRECLKX signal are 30 microns wide. The purpose for this disparity is presented later following an explanation of the operation of the current circuitry in commencing the precharge phase of operation.

With respect to the circuitry related to the evaluate phase of operation of PD2 in FIG. 10, like PD2 of FIG. 7 each discharge path necessarily includes an n-channel discharge transistor having its gate connected to the CLOCK signal; to distinguish it from an additional transistor, however, in FIG. 10 this n-channel transistor is designated as DT1. As an addition, PD2 of FIG. 10 includes a second n-channel discharge transistor DT2 connected with its source/drain in series with the source/drain of DT1. Moreover, the gate of DT2 is connected to the WLPRECLKX signal. Lastly, note that while DT2 is an LVT transistor, DT1 is not (i.e., the $V_T$ of DT1 is relatively high as compared to the $V_T$ of DT2). Thus, during the time when the CLOCK signal is not enabling to DT1 (i.e., when the signal is high), the relatively high $V_T$ of DT1 will operate to limit the amount of leakage current to ground.

The operation of the precharge and evaluate phases of PD2 of FIG. 10 is as follows, and is now understood by viewing FIG. 10 along with the timing diagram of FIG. 9. Returning to t1, note that the high state of WLPRECLKX is enabling to DT2, and further that TR3 of the CLOCK signal causes DT1 to begin to conduct. Thus, once DT1 sufficiently conducts, PD2 begins its evaluate phase of operation. Consequently, in response to the values of address bits A2, A1, and A0, one of the discharge paths discharges its corresponding precharge node. Note that the series connection of DT2 with DT1 permits the evaluate phase to therefore commence as soon as DT2 is sufficiently conducting (i.e., because DT1 is already conducting at that point). Given this operation, one skilled in the art may now appreciate why this series connection is favorable over a separate AND gate embodiment such as mentioned above at the end of the discussion of FIG. 9. Particularly, an embodiment with a separate AND gate would require additional delay through the operation of the AND gate before an enabling signal would be connected to the gate of DT1. In contrast, the series connection of DT1 and DT2, with the WLPRECLKX signal enabling DT2, permits the evaluate phase of PD2 to begin as soon as DT2 is sufficiently conducting, and without the additional delay which would be imposed by using a separate AND gate. In any event, given that the evaluate phase of PD2 is commenced at t2, then one of the PD2 data signal outputs begins to rise. Next, at t3, the falling level caused by TR5 of WLPRECLKX disables DT2. Thus, the evaluate phase of PD2 ends. At the same time, the falling level of TR5 causes each of precharge transistors $PT_{0b}$ through $PT_{7b}$ to conduct. Thus, the precharge phase of operation for PD2 begins and its data signal transitions at TR6 from high to low, having enabled a discharge path in one of the decoder sets to which its data outputs are connected. Given an appreciation of this commencement of the precharge phase of operation, it is also now instructive to examine why the p-channel precharge transistors having the "b" within their subscripts are preferably sized considerably larger than the p-channel precharge transistors having the "a" within their subscripts as noted earlier. More particularly, it should now be apparent to one skilled in the art that the falling transition of WLPRECLKX at t5 commences the precharge phase of operation through the operation of the "b" p-channel precharge transistors. Thus, these transistors bear the responsibility of causing precharge nodes $PN_0$ through $PN_7$ to transition from low to high; accordingly, these transistors must be sized to properly insure such a transition. In contrast, and as appreciated from the discussion below, the "a" p-channel precharge transistors merely must maintain the precharged state of precharge nodes $PN_0$ through $PN_7$, rather than having to instigate the transition thereof. Thus, these latter transistors may be of considerably reduced relative size.

The circuit configuration of PD2 of FIG. 10 further reveals that the precharge period continues after the two above-described actions of performing the evaluate phase and then commencing the precharge phases of operation through the operation of WLPRECLKX. Specifically, at t5, TR7 in the CLOCK signal occurs which, as described above, shortly thereafter causes TR8 in the WLPRECLKX signal at t6. Note then that after t6 the low CLOCK signal prevents DT1 from conducting and therefore prevents an evaluate phase from occurring, while the high WLPRECLKX signal does not enable any of the precharge transistors to which it is connected (i.e., $PT_{0b}$ through $PT_{7b}$). During this same time, however, the low CLOCK signal causes each of the "a" precharge transistors to which it is connected (i.e., $PT_{0a}$ through $PT_{7a}$) to conduct. Recall that these latter transistors $PT_{0a}$ through $PT_{7a}$ are relatively small when compared to $PT_{0b}$ through $PT_{7b}$. Nevertheless, because precharge nodes $PN_0$ through $PN_7$ were already pulled high by the falling edge of WLPRECLKX, these smaller transistors $PT_{0a}$ through $PT_{7a}$ are still sufficient while conducting to maintain precharge nodes $PN_0$ through $PN_7$ at the precharge voltage and, thus, to effectively continue the precharge phase of operation.

Figure 11:
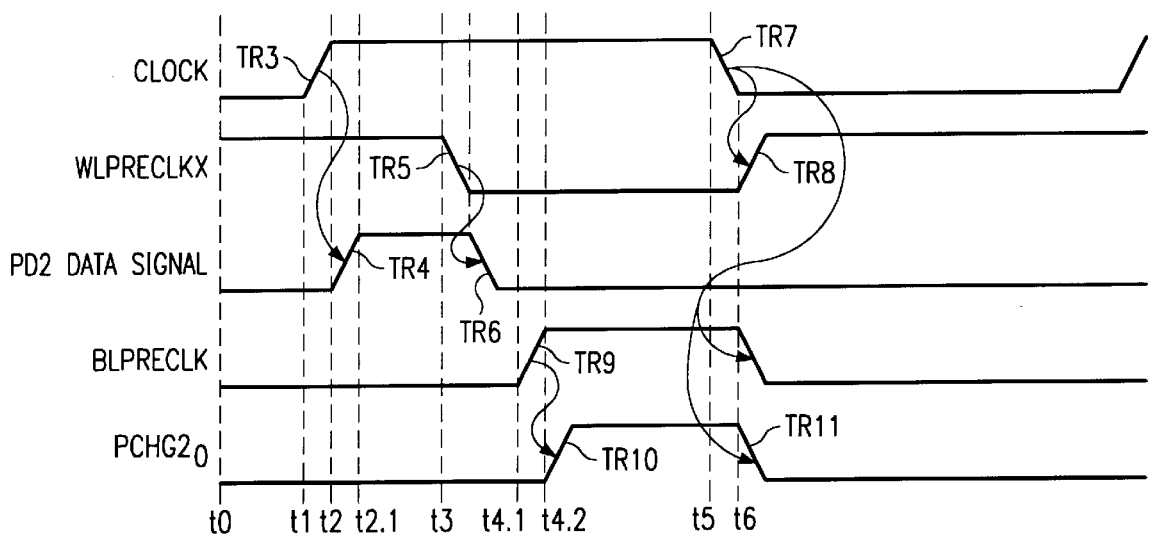
FIG. 11 illustrates a timing diagram of an alternatively produced precharge signal, wherein the transitions of PCHG2 are controlled in a manner which do not coincide with the PD2 data signal.

Having demonstrated in FIGS. 9 and 10 the preferred operation and circuitry of PD2 with respect to its evaluate phase of operation, recall also that it is preferable that it generate precharge signals to control the precharge phase of operation of the decoder sets. In this regard, FIG. 11 illustrates a timing diagram which includes the signals from FIG. 9, but includes additional signals in order to introduce the preferred circuit configuration to be included with PD2 for generating the precharge signal for the decoder sets. Looking to FIG. 11, again it does not precisely demonstrate the exact delays between signal transitions but, instead, it depicts in general the succession of events following various signal transitions. Turning specifically to those signals, FIG. 11 includes a signal BLPRECLK which is not to be confused with the WLPRECLKX signal introduced earlier. The details of generating the BLPRECLK signal are described later. At this point, however, it is sufficient to note with respect to BLPRECLK that it is asserted at a time when sense amplifier circuit 14 (see FIG. 1) has enough differential bit line voltage to read the information and the addressed wordline can be turned off. Thus, the assertion of BLPRECLK will be at some time after the assertion of WLPRECLKX and, in FIG. 11, the assertion of BLPRECLK is therefore shown as transition TR9 occurring at a time t4.1.

FIG. 11 further includes a signal which relates to the precharging of the decoder sets, where the signal is labeled as $PCHG2_0$ in FIG. 11. Note that the "0" subscript is included to suggest that this precharge signal corresponds to the data signal $PD2_0$ and, thus, by the convention used herein, one skilled in the art will appreciate that seven additional precharge signals (i.e., $PCHG2_1$ through $PCHG2_7$) are likewise generated to correspond to the remaining seven data signals $PD2_1$ through $PD2_7$. Returning to $PCHG2_0$, and for reasons detailed later, note that this signal is actually modified in one additional manner beyond that shown in FIG. 11 before it is used to enable the precharge phase of operation of the decoder sets. Thus, the number "2" is added to the signal for purposes of FIG. 11 discussion, while that number is later removed to create a signal $PCHG_0$ to actually drive the precharge operation of the decoder sets. Looking now more closely to the generation of the $PCHG2_0$ signal, recall that TR5 of WLPRECLKX causes TR6 of the PD2 data signal; recall also that this means that that the evaluate phase of PD2 is over soon after the assertion of WLPRECLKX. The present inventor has combined this recognition with the point at the end of the preceding paragraph, and that is that the assertion of BLPRECLK will be at some time after the assertion of WLPRECLKX. Thus, it is possible, and indeed implemented as part of the preferred embodiment, to use the assertion of BLPRECLK signal at TR9 to cause the beginning of the precharge phase of the decoder set which was just discharged by the PD2 data signal during the evaluate phase of PD2. Consequently, in FIG. 11, this causal relationship is shown by arrows demonstrating that the assertion of BLPRECLK by its TR9 transition at t4.1 causes the transition TR10 in the $PCHG2_0$ signal at t4.2. Thus, the $PCHG2_0$ signal may be used, as detailed below, to then enable the precharge phase of operation for the decoder sets. At t5 when the CLOCK transition TR7 occurs, this transition is then used to cause PCHG2 to have another transition TR11 at t6. Thus, at t6, the precharge phase of operation of the decoder set ends in response to the TR11 transition of $PCHG2_0$, as modified further as discussed below.

Before illustrating the preferred embodiment circuit configuration used to generate the precharge signal $PCHG2_0$ of FIG. 11, note yet an additional aspect of the preferred embodiment with respect to precharging only a limited number of all of the precharge nodes in each decoder set Specifically, recall from FIGS. 4a and 4b that the preferred embodiment of the decoder sets is such that the decoder sets in their entirety include a total of 256 precharge nodes corresponding to 256 respective wordlines. Thus, for a given evaluate phase of the decoder sets, only one of the 256 precharge nodes is discharged. Therefore, the present inventor has recognized that there is no need to precharge all 256 precharge nodes for each cycle of operation, because in fact only one of those precharge nodes is discharged in the preceding evaluate cycle and, thus, ideally only that one precharge node need be precharged before the next evaluate cycle. Having appreciated the desire to precharge less than all the decoder sets precharge nodes, the present inventor further appreciates that the one of 256 nodes which was discharged in the immediately preceding evaluate cycle was discharged in response to only one of the eight PD2 data signals. Thus, as presented below, the preferred embodiment causes only the precharge nodes which could have been discharged by that one PD2 data output to be successively precharged in the immediately subsequent precharge phase of operation. In other words, to commence a given precharge phase of operation of the decoder sets, the preferred embodiment enables precharging of only the precharge nodes in the decoder sets which correspond to the one of eight PD2 outputs which was just enabled in the immediately preceding evaluate phase. The specifics of this concept are further appreciated in connection with FIG. 12, below.

Having examined FIG. 11, note now how it contrasts to the signals and concepts described earlier with respect to the timing diagrams of FIG. 8. Specifically, recall that FIG. 8 demonstrates the use of the same node (i.e., a precharge node) to provide a drive signal through respective inverters for both a data signal (e.g., $PD2_0$) and a precharge signal (e.g., PRE0). From that aspect, it was concluded that the timing of these two signals remains relatively the same as shown in FIG. 8, with only some flexibility relating to the speed of the transitions of those signals. In stark contrast, note the added flexibility provided in FIG. 11. For example, the data signal transition (i.e., TR4) now does not track the beginning of the precharge signal to the decoder sets (i.e., TR10, as modified as discussed below). Thus, a change to the former does not as directly affect the latter. As another example, by having the data signal and precharge signals driven by different nodes, the data signal need not be asserted for the full time that the precharge signal is in its unasserted state; in other words, as shown in FIG. 11, the data signal may be turned off, at TR6, which is therefore before the precharge signal transitions to begin the precharge phase of operation of the decoder sets at TR10. Lastly, because the same node is not directly driving, through inverters, both the data and precharge signals, then the loading which otherwise would be created by such an approach may be reduced.

Figure 12:
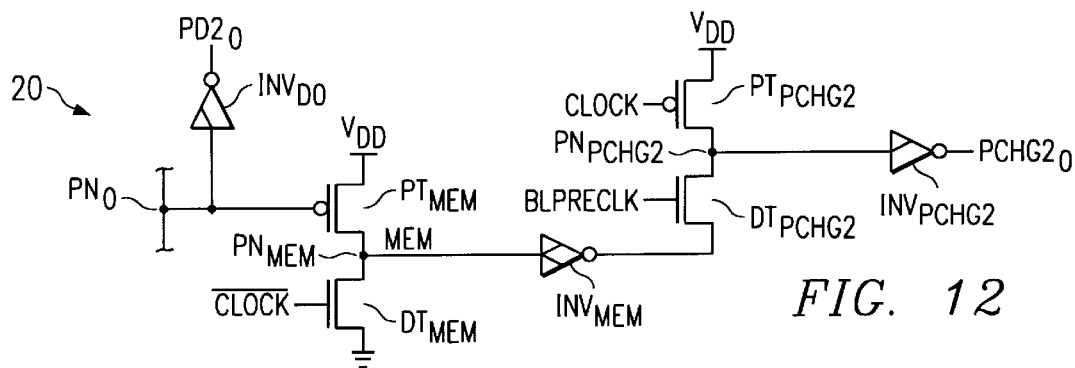
FIG. 12 illustrates a partial schematic of PD2 including circuitry for providing the timing signals shown in FIG. 11.

FIG. 12 illustrates a schematic of the preferred embodiment circuit configuration 20 for generating the $PCHG2_0$ signal to correspond to $PD2_0$, both as provided by PD2. To simplify the illustration as well as the following discussion, note that configuration 20 only pertains to one of the precharge nodes of PD2, namely, precharge node $PN_0$. Nevertheless, circuit configuration 20 is understood to be repeated for each of the other seven precharge nodes (i.e., $PN_1$ through $PN_7$) of PD2 as well. Also to simplify FIG. 12, only $INV_{D0}$ is carried forward from the earlier illustrations with respect to $PN_0$ while various other already-described elements relating to $PN_0$ are not shown (e.g., precharge transistors, discharge path, etc.) and the reader is referred to the earlier discussion for more detail.

The various elements and interconnections of circuit configuration 20 are as follows. $PN_0$ is connected to the gate of a p-channel precharge transistor $PT_{MEM}$, where that transistor is related to the signal MEM described later. The source of $PT_{MEM}$ is connected to $V_{DD}$, and the drain of $PT_{MEM}$ is connected to a precharge node $PN_{MEM}$, which provides the MEM signal and is connected both to the drain of an n-channel discharge transistor $DT_{MEM}$ as well as to the input of an inverter $INV_{MEM}$. With respect to $INV_{MEM}$, note it is shown as having a short diagonal line in the upper half of the inverter symbol. Recall from earlier that, in this document, this symbol is included as a convention to demonstrate that a p-channel transistor (not expressly illustrated) is connected in a feedback manner from the output of the inverter to its input. More particularly, the gate of the feedback p-channel transistor is connected to the output of the corresponding inverter, the source of the feedback p-channel transistor is connected to $V_{DD}$, and the drain of the feedback p-channel transistor is connected to the input of the corresponding inverter. Similarly, note that $INV_{MEM}$ is also shown as having a short diagonal line in the lower half of the inverter symbol. Also for purposes of this document, the lower diagonal line is used in a similar fashion to the upper diagonal line described immediately above, but the lower line indicates a feedback n-channel transistor connected from the output back to the input of the corresponding inverter. The feedback n-channel transistor has its gate connected to the output of the inverter, its source connected to ground, and its drain connected to the input of the inverter. Returning to $DT_{MEM}$, its source is connected to ground, and its gate is connected to receive the complement of the CLOCK signal (shown as $\overline{CLOCK}$ in FIG. 12). The output of inverter $INV_{MEM}$ is connected to the source of an n-channel discharge transistor $DT_{PCHG2}$, which has its gate connected to receive BLPRECLK and its source connected to a precharge node $PN_{PCHG2}$. $PN_{PCHG2}$ is further connected to the input of an inverter $INV_{PCHG2}$ as well as to the drain of a p-channel precharge transistor $PT_{PCHG2}$. The source of $PT_{CHG2}$ is connected to $V_{DD}$ and the gate of $PT_{PCHG2}$ is connected to receive the CLOCK signal. Lastly, note that the symbol for $INV_{PCHG2}$ has a diagonal line in the upper half of the inverter symbol. Thus, consistent with the convention introduced earlier, this line indicates that a p-channel transistor (not expressly illustrated) is connected in a feedback manner from the output of the inverter to its input.

The operation of circuit configuration 20 is as follows, and is described in relation to the illustration of the timing signals in FIG. 11 starting at time t2 at working generally from left to right in FIG. 12. At t2, the CLOCK is high and, thus, its complement is low. Consequently, $DT_{MEM}$ is disabled. At t2.1, while $DT_{MEM}$ remains disabled, $PN_0$ is discharged by enabling the discharge path (not shown) which connects it to ground, and thus the $PD2_0$ data signal transitions from low to high as shown by TR4. This discharging of $PN_0$ is enabling to $PT_{MEM}$, thereby precharging $PN_{MEM}$ to $V_{DD}$. Note, therefore, that in response to the assertion of the PD2 data signal, MEM changes state from low to high (and its complement which is output by $INV_{MEM}$ changes from high to low), thereby "memorizing" the fact that the particular PD2 output (e.g., $PD2_0$) was asserted. This MEM signal (and its complement) is useful as shown later to accomplish the function stated above, that is, to provide a precharging signal to a limited number of precharge transistors in the decoder sets rather than to all of the precharge transistors in the decoder sets.

Continuing with the operation of circuit configuration 20, the state of the MEM signal determines whether $PCHG2_0$ is ultimately asserted for a given corresponding precharge node of PD2 (where that node is $PN_0$ in the example of FIG. 12). As shown by the following, if MEM is high as in the preceding paragraph, then after the following timing events $PCHG2_0$ is asserted. Thus, assuming MEM is high, then the output of $INV_{MEM}$ is low and this low is connected to the source of $DT_{PCHG2}$. Next, at t4.1, BLPRECLK is asserted and enables $DT_{PCHG2}$. When $DT_{PCHG2}$ conducts in response to this event, then the precharge voltage at $PN_{PCHG2}$ (which was charged when CLOCK was low prior to t1) is discharged, thereby inputting a low signal to $INV_{PCHG2}$ and causing $PCHG2_0$ to transition from low to high at t4.2. Lastly, at t5, CLOCK transitions from high to low, thereby beginning to enable $PT_{PCHG2}$ and causing a high to low transition in BLPRECLK which disables $DT_{PCHG2}$. At the same time, the complement of this falling transition, that is, the signal $\overline{CLOCK}$, begins to enable $DT_{MEM}$ and causes MEM to fall to ground. Lastly, at t6 and in response to the enabling of $PT_{PCHG2}$, $PN_{PCHG2}$ is again precharged and $PCHG2_0$ transitions from high to low.

In contrast to the preceding paragraph, note now that if MEM remains low (i.e., if the particular PD2 data signal is not asserted in the preceding evaluate cycle), $PCHG2_0$ is not then asserted. More specifically, assuming MEM is low, then the output of $INV_{MEM}$ is high and this high is connected to the source of $DT_{PCHG2}$. Next, at t4.1, BLPRECLK is asserted and connects a high signal to the gate of $DT_{PCHG2}$; however, because the output of $INV_{MEM}$ is connecting a high signal to the source of $DT_{PCHG2}$, then the gate-to-source voltage of $DT_{PCHG2}$ does not exceed the threshold voltage of the transistor and, thus, it does not conduct. Consequently, there is no discharging event at $PN_{PCHG2}$ and, since $PN_{PCHG2}$ is connected to $INV_{PCHG2}$, the output of $INV_{PCHG2}$ remains unchanged (i.e., remains low).

Concluding with some observations regarding FIGS. 11 and 12, note now that the preferred embodiment of PD2 provides a precharge signal, $PCHG2_0$, which is timed in a manner such that its transitions do not occur at the same time as the transitions of the PD2 data signal, as would be the case under the embodiment illustrated in connection with FIGS. 7 and 8. Thus, additional efficiency is obtained in that TR4 and TR10 each may be tailored to transition relatively quickly to begin the responsive action (i.e., enabling the data signal to address a wordline and beginning the precharge phase of operation for a decoder set, respectively). Moreover, given the preferred embodiment, TR6 and TR11 may be slower thereby imposing less significant demands on the circuit requirements to accomplish these transitions. Still further, note the contrast in loading on $PN_0$ (and the other like configured precharge nodes of PD2) with respect to generating the precharge signal for the decoder set, based on a comparison of FIG. 7 and FIG. 12. More particularly, FIG. 7 illustrates two inverter approach, whereby $PN_0$ is considerably loaded to drive the additional inverter $INV_{PRE0}$. Conversely, in FIG. 12, with respect to generating the precharge signal, the only additional load perceived by $PN_0$ is the drive required for the gate of $PT_{MEM}$.

Figure 13:
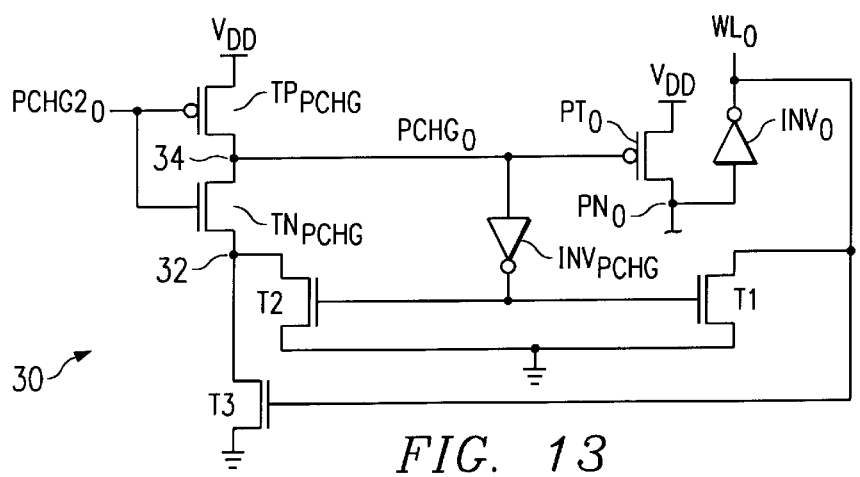
FIG. 13 illustrates a schematic of a circuit configuration for converting the $PCHG2_0$ signal of FIGS. 11 and 12 to a $PCHG_0$ signal for conditionally precharging a corresponding precharge node in the decoder set.

As another observation with respect to FIG. 12, note that $PCHG2_0$ as realized by circuit configuration 20 and shown in FIG. 11 is asserted as a high signal. However, because this signal is intended for use to enable p-channel precharge transistors in the decoder sets, then it must be asserted as a low signal. Thus, FIG. 13 illustrates a schematic which effectively inverts the $PCHG2_0$ signal to generate an ultimate $PCHG_0$ signal for coupling to the p-channel precharge transistors of the decoder sets, and that schematic is shown in general as a circuit configuration 30. At the outset, note that circuit configuration 30 depicts, for purposes of simplifying the drawing and the following discussion, only a single circuit in association with one of the 256 wordlines of the preferred embodiment, namely, $WL_0$. Nevertheless, one skilled in the art will appreciate that the circuitry of circuit configuration 30 is actually replicated for each of the other 255 wordlines as well.

Turning now to the single example of FIG. 13, circuit configuration 30 converts the $PCHG2_0$ signal of FIGS. 11 and 12 to a $PCHG_0$ signal for precharging a precharge node corresponding to $WL_0$ in the decoder sets, and provides additional functional circuitry described below. Looking to the connections of circuit configuration 30, the $PCHG2_0$ signal is connected to an inverter including a p-channel transistor $TP_{PCHG}$ and an n-channel transistor $TN_{PCHG}$; more particularly, the $PCHG2_0$ signal is connected to the gates of these two transistors, with the source of $TP_{PCHG}$ connected to $V_{DD}$, the source of $TN_{PCHG}$ connected to a node 32, and the drain of both $TP_{PCHG}$ and $TN_{PCHG}$ connected to a node 34 which provides the $PCHG_0$ signal. Node 34 is connected to the gate of $PT_0$, and also to the input of an inverter $INV_{PCHG}$. $PT_0$ is connected as described earlier in connection with FIGS. 4a–4b and, thus, through an inverter $INV_0$ provides an output to a wordline $WL_0$. However, additional circuitry not discussed in FIGS. 4a–4b is also associated with $WL_0$ as detailed below.

Wordline $WL_0$ is connected to the drain of an n-channel transistor T1, which has its source connected to ground and its gate connected to the output of $INV_{PCHG}$. The output of $INV_{PCHG}$ is also connected to the gate of an n-channel transistor T2, which has its source connected to ground and its drain connected to node 32. Lastly, $WL_0$ is also connected to the gate of an n-channel transistor T3, which has its source connected to ground and its drain connected to node 32.

Figure 14:
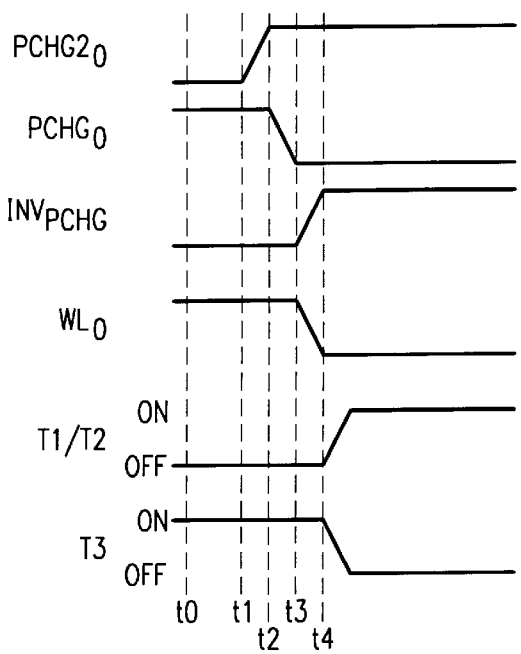
FIG. 14 illustrates a timing diagram of various signals generated by the operation of the circuit configuration of FIG. 13.

The operation of FIG. 13 is understood with reference to the timing diagram of FIG. 14, where the top four signals demonstrate the logic levels along the signals as shown by the labeling of each signal, while the lower two signals represent generally the conductive state of transistors T1, T2, and T3 of circuit configuration 30 (with transistors T1 and T2 shown together because the gates of both transistors are controlled by the same signal). Like earlier timing diagrams, note that FIG. 13 does not purport to precisely demonstrate the exact delays between signal transitions but, instead, merely demonstrates in general the succession of events following the assertion of $PCHG2_0$.

Looking to FIG. 14, at t0 $PCHG2_0$ is not yet asserted (i.e., it is low) and, thus, the decoder set represented by $PT_0$ is in its evaluate phase. More particularly, the low value of $PCHG2_0$ is enabling to $TP_{PCHG}$ and, thus, node 34 is pulled high as shown by the value of $PCHG_0$ at t0. This high value of $PCHG_0$ is disabling to $PT_0$. Moreover, the inverted value of $PCHG_0$, as shown by $INV_{PCHG}$, is disabling to both T1 and T2, so they are shown as off in FIG. 14. Next, and for purposes of illustration, note that it is assumed that $WL_0$ of FIG. 13 is being asserted, that is, the discharge path (not shown in FIG. 13, but see FIGS. 4a–b) connected to $PN_0$ has conducted and discharged $PN_0$. Accordingly, also at t0, $WL_0$ is high. Lastly, note that the high value of $WL_0$ is enabling to T3 and, thus, it is shown as on in FIG. 14.

At t1, $PCHG2_0$ transitions high, preferably in the manner described earlier in connection with FIG. 12. This transition disables $TP_{PCHG}$ and enables $TN_{PCHG}$. Recall that T3 was already on due to the asserted $WL_0$, and thus at t1 connects node 34 to ground, thereby causing $PCHG_0$ to transition from high to low at t2. As $PCHG_0$ transitions to low, it enables $PT_0$, thereby precharging $PN_0$ which, when inverted by inverter $INV_0$, causes $WL_0$ to transition also at t3 from high to low. Additionally, at the same time, the downward transition of $PCHG_0$ causes the output of $INV_{PCHG}$ to transition at t3 from low to high, thereby enabling both T1 and T2 at t4.

Note now some additional observations regarding the added effect of T1 and T2. With respect to T1, it assists in ensuring that wordline $WL_0$ is pulled low while $WL_0$ is also being turned off; in other words, it assists the operation of the output of inverter $INV_0$ to maintain a low signal at $WL_0$ as the precharge phase of operation commences. Note that this operation occurs without requiring a direct drive signal from $PN_0$ to the gate of the transistor, T1. Thus, the load on the precharge node $PN_0$ is reduced. With respect to T2, it ensures that node 32 is maintained low during the precharge phase of operation, even after T3 is turned off. In other words, as $WL_0$ falls after t3, it may cause T3 to turn off. Thus, to prevent any floating of node 32, T2 continues to actively conduct after t3, thereby ensuring that node 32 remains connected to ground during the remainder of the precharge phase of operation and, indeed, until $PCHG2_0$ is later once again asserted from high to low, thereby causing PCHG0 to transition from low to high.

Figure 15:
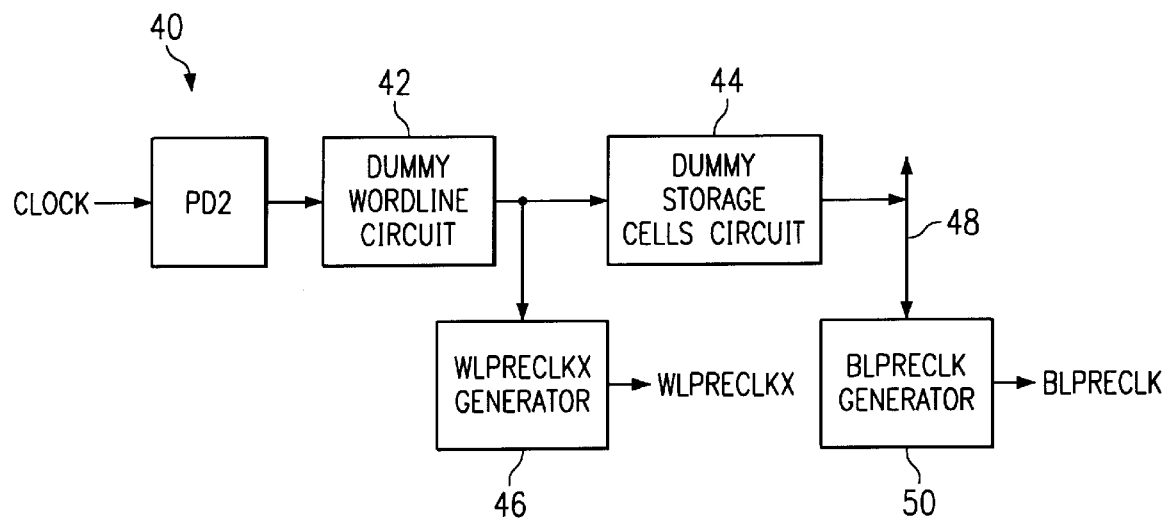
FIG. 15 illustrates a block diagram of various dummy circuits implemented to time the transitions of the WLPRE-CLKX and BLPRECLK signals.

FIG. 15 illustrates a block diagram of a circuit configuration 40 to facilitate a general discussion of the creation and timing of the WLPRECLKX and BLPRECLK signals described earlier. Circuit configuration 40 first starts with PD2, described in lengthy detail above. The eight outputs of PD2 are connected in a logical OR fashion to the input of a dummy wordline circuit 42. Dummy wordline circuit 42 is constructed according to known principles for forming "dummy" circuits, and simulates an approximation of the loading anticipated by a wordline in storage circuit 12. In other words, and as known in the art, dummy wordline circuit 42 may be implemented such as by duplicating a wordline in storage circuit 12, but in any case should provide a load which presents the approximate delay to be anticipated in enabling a wordline once a data signal is asserted from PD2. The output of dummy wordline circuit 42 is connected to the input of a dummy storage cells circuit 44 as well as to the input of WLPRECLKX generator 46, the latter of which is described later. Dummy storage cells circuit 44 is constructed to simulate the worst case loading to be provided by a row of storage cells in storage circuit 12. Thus, in the present embodiment, since storage circuit 12 includes rows of 32 cells each, then dummy storage cells circuit 44 presents the anticipated load of 32 such cells, again which may be accomplished by duplicating a row of cells within circuit 44. In any case, the signal delay through circuit 44 (i.e., the time for an output transition in response to an input transition) should match or exceed that which is presented by an actual row of cells within storage circuit 12. The output of dummy storage cells circuit 44 is connected via a dummy bitline (again with a load to simulate that of a bitline in storage circuit 12) to a BLPRECLK generator 50. Both the WLPRECLKX generator 46 and BLPRECLK generator 50 may be constructed by one skilled in the art, such as through the use of dynamic circuitry, and to achieve the timing effects described below in connection with FIG. 16.

Figure 16:
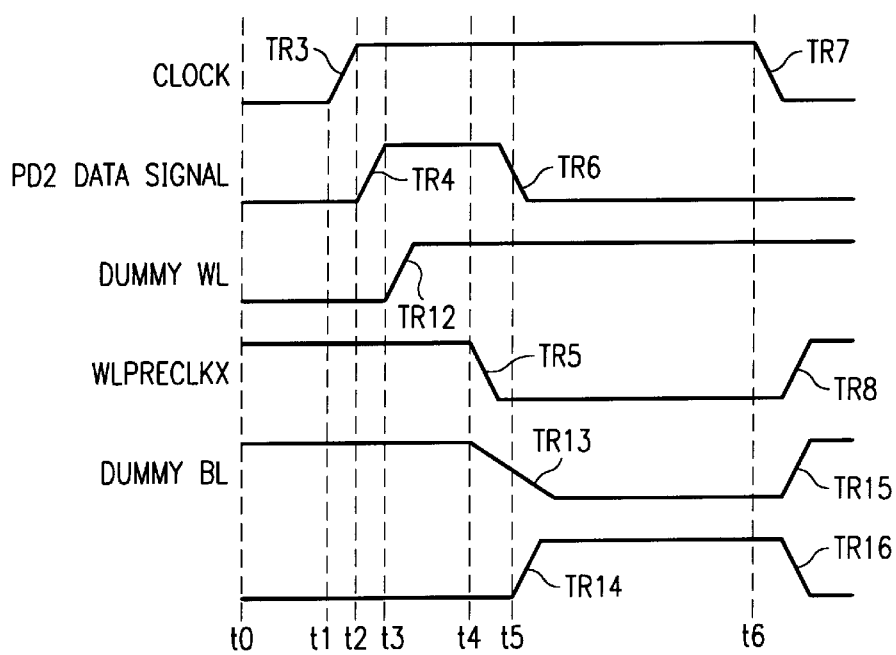
FIG. 16 illustrates a timing diagram of the various signal transitions resulting from the block diagram of FIG. 15.

FIG. 16 illustrates a timing diagram of the operation of circuit configuration 40 of FIG. 15. At the outset, note that the four of the signals in FIG. 16 are repeated from FIG. 11, namely, CLOCK, PD2 data signal, WLPRECLKX, and BLPRECLK, and therefore the reader is assumed familiar with the earlier discussion. Moreover, for the current FIG. 16, these signals are shown in a different order so as to better appreciate the succession of signal transitions as well as the relationship to the two additional signals which represent the output of dummy wordline circuit 42 (shown as "DUMMY WL") and the signal transition along dummy bitline 48 (shown as "DUMMY BL"). Starting at t1, therefore, the CLOCK signal transitions high, which is shown as TR3 to carry forward the same conventions used in FIG. 11. As described earlier in connection with FIG. 11, TR3 thereafter at t2 causes a rising transition TR4 in one of the eight PD2 outputs, with that one signal shown as the PD2 data signal in FIG. 16. The TR4 transition then passes through the delay of dummy wordline circuit 42 and, in response, at t3 a rising transition TR12 occurs at the output of dummy wordline circuit 42 and is input to both dummy storage cells circuit 44 and to WLPRECLKX generator 46.

The responses of dummy storage cells circuit 44 and of WLPRECLKX generator 46 to the rising TR12 transition output by dummy wordline circuit 42 are as follows. With respect to WLPRECLKX generator 46, the rising TR12 transition at its input triggers a rising output transition, as may be achieved by enabling a discharge path through dynamic logic in WLPRECLKX generator 46. In such an approach or in an alternative as may be constructed by one skilled in the art, at t4 a falling transition TR5 occurs in the WLPRECLKX signal. This falling TR5 transition, as detailed in connection with FIG. 11, thereafter causes a falling transition TR6 in the PD2 data signal. With respect to dummy storage cells circuit 44, the rising TR12 transition at its input incurs a delay (i.e., the simulated row of storage cells) and, in response, at t4 a falling transition TR13 occurs at the output of dummy wordline circuit 42 and is connected to dummy bitline 48. Note that in the preferred embodiment the delay of dummy bitline 48 further slows this transition, as is shown by the reduced slope of the transition of the TR13 transition as compared to the TR5 transition in WLPRECLKX which also begins at t4. Also with respect to the TR13 transition, note that during its occurrence and at t5, BLPRECLK generator 50 is caused to output a rising transition TR14. In other words, the TR13 transition along dummy bitline 48 is input to BLPRECLK generator 50 and triggers an output transition, as again may be achieved by enabling a discharge path through dynamic logic within BLPRECLK generator 50. Note also that t5 preferably occurs at the time when the TR13 transition along dummy bitline 48 reaches its midpoint between $V_{cc}$ and ground. Lastly, note at t6 that the CLOCK signal has its TR7 falling transition, which causes rising transitions TR8 in WLPRECLKX and TR15 along dummy bitline 48, and also causes a falling transition TR16 in BLPRECLK.

From the above, it may be appreciated that the above embodiments provide numerous advantages. For example, a memory circuit constructed according to the above inventive scope may be used in various different types of devices, including microprocessors, digital signal processors, and application specific integrated circuits. As another example, while the illustrated embodiments relate to a 256 wordline memory system, dearly many of the present teachings may be modified to accommodate a different number of wordlines. As yet another benefit, numerous aspects provided above improve the speed of operation of the address decoding functionality and, thus, provide faster access to data stored in the memory system. Additional advantages have been set forth earlier, and as yet another advantage note that while the present embodiments have been described in detail, various other substitutions, modifications or alterations could be made to the descriptions set forth above as demonstrated by the various earlier examples, and still additional considerations as ascertainable by one skilled in the art. Thus, these aspects and the described embodiments are all considered within the inventive scope, as defined by the following claims.

I claim:

1. A memory configuration for outputting information in response to an address, comprising
   an array of memory cells aligned in an array having an integer number N of wordlines;
   a plurality of predecoders, each operable to receive a corresponding portion of the address;

a plurality of decoder sets, each having a plurality of wordline enable outputs, wherein each of the plurality of wordline enable outputs corresponds to a respective one of the integer number N of wordlines and is operable to assert an enabling signal to the respective one of the integer number N of wordlines;

wherein each of the plurality of predecoders comprises:
a plurality of predecoder precharge nodes, wherein each of the plurality of predecoder precharge nodes is operable to be precharged to a precharge voltage during a predecoder precharge phase;
a plurality of predecoder conditional series discharge paths, each connected to a corresponding one of the plurality of predecoder precharge nodes and each operable in response to the corresponding portion of the address to discharge the precharge voltage at the corresponding predecoder precharge node during a predecoder evaluate phase; and
a plurality of predecoder inverters, each having an input coupled to a corresponding one of the plurality of predecoder precharge nodes and having an output for providing a data signal; and wherein each of the plurality of decoder sets comprises:
a plurality of decoder precharge nodes, wherein each of the plurality of decoder precharge nodes is operable to be precharged to a precharge voltage during a decoder precharge phase;
a plurality of decoder conditional series discharge paths, each connected to a corresponding one of the plurality of decoder precharge nodes and each operable in response to selected ones of the data signals from the plurality of predecoder inverters to discharge the precharge voltage at the corresponding decoder precharge node during a decoder evaluate phase; and
a plurality of decoder inverters, each having an input coupled to a corresponding one of the plurality of decoder precharge nodes and having an output for providing one of the plurality of wordline enable outputs; and wherein one of the plurality of predecoders further comprises a plurality of precharge output signal circuits, each coupled to a corresponding one of the plurality of predecoder precharge nodes; and wherein each of the plurality of precharge output signal circuits is for providing a precharge output signal for commencing the decoder precharge phase of a group of the plurality of decoder precharge nodes.

2. The memory configuration of claim 1 wherein each of the plurality of precharge output signal circuits is operable to selectively provide the precharge output signal to only those decoder precharge nodes which receive an enabling data signal from the one of the plurality of predecoders in an immediately preceding decoder evaluate phase.

3. The memory configuration of claim 1 wherein the precharge output signal is operable to be asserted by at least one of the plurality of precharge output signal circuits and only after a data signal from the one of the plurality of predecoders in an immediately preceding predecoder evaluate phase is de-asserted.

4. The memory configuration of claim 1 wherein a data signal from the one of the plurality of predecoders in a predecoder evaluate phase is operable to be de-asserted before the precharge output signal is asserted by at least one of the plurality of precharge output signal circuits.

5. The memory configuration of claim 1 wherein a data signal from the one of the plurality of predecoders is operable to be asserted only after the precharge output signal from one of the plurality of precharge output signal circuits in an immediately preceding predecoder precharge phase is de-asserted.

6. The memory configuration of claim 1 wherein a precharge output signal from one of the plurality of precharge output signal circuits in a predecoder precharge phase is operable to be de-asserted before a data signal is asserted from the one of the plurality of predecoders.

7. The memory configuration of claim 1 wherein each of the plurality of precharge output signal circuits comprises:
a first p-channel transistor having its source connected to receive a first voltage and its gate connected to a corresponding one of the plurality of predecoder precharge nodes;
a first n-channel transistor having its source connected to receive a second voltage lower than the first voltage, its gate coupled to receive a signal which enables the first n-channel transistor during the predecoder precharge phase, and its drain connected to a drain of the first p-channel transistor;
a first inverter having its input connected to the drain of the first p-channel transistor and to the drain of the first n-channel transistor;
a second n-channel transistor having its source connected to the output of the first inverter and its gate connected to receive a signal which enables the second n-channel transistor at a time when the corresponding one of the plurality of predecoder precharge nodes is precharged to the precharge voltage during the predecoder precharge phase;
a second p-channel transistor having its source connected to receive the first voltage and its gate connected to receive a signal which enables the second p-channel transistor during the predecoder precharge phase; and
a second inverter having its input connected to the drain of the second p-channel transistor and to the drain of the second n-channel transistor.

8. The memory configuration of claim 7 wherein each of the plurality of decoder sets further comprises:
a third p-channel transistor having its source connected to receive the first voltage and its gate connected to the output of the second inverter;
a third n-channel transistor having its drain connected to the drain of the third p-channel transistor and its gate connected to the output of the second inverter; and
wherein the drains of the third p-channel transistor and the third n-channel transistor are connected to provide the precharge output signal for commencing the decoder precharge phase of a group of the plurality of decoder precharge nodes.

9. The memory configuration of claim 8 wherein each of the plurality of decoder sets further comprises:
a third inverter having its input connected to the drain of the third n-channel transistor and to the drain of the third p-channel transistor;
a fourth n-channel transistor having its gate connected to the output of the third inverter, its source connected to receive the second voltage, and its drain connected to the source of the third n-channel transistor;
a fifth n-channel transistor having its source connected to the second voltage, its drain connected to the source of the third n-channel transistor, and its gate connected to a corresponding one of the plurality of wordline enable outputs; and a sixth n-channel transistor having its gate connected to the output of the third inverter, its source connected to receive the second voltage, and its drain connected to the corresponding one of the plurality of wordline enable outputs.

10. The memory configuration of claim 1:

wherein the integer number N is 256;

wherein the plurality of predecoders is three predecoders; and wherein the plurality of decoder sets is eight decoder sets.

11. The memory configuration of claim 1:

wherein each of the plurality of predecoder conditional series discharge paths comprises a plurality of n-channel transistors; and wherein at least one n-channel transistor in each of the plurality of predecoder conditional series discharge paths has a threshold voltage lower than a threshold voltage of another n-channel transistor in the predecoder conditional series discharge path.

12. The memory configuration of claim 1:

wherein each of the plurality of decoder conditional series discharge paths comprises a plurality of n-channel transistors; and wherein at least one n-channel transistor in each of the plurality of decoder conditional series discharge paths has a threshold voltage lower than a threshold voltage of another n-channel transistor in the decoder conditional series discharge path.

13. The memory configuration of claim 1:

wherein each of the predecoder inverters comprises a p-channel transistor having a first threshold voltage;

wherein each of the plurality of predecoders further comprises a p-channel transistor pull-up transistor having a second threshold voltage and having its source connected to receive the precharge voltage and its drain coupled to a corresponding one of the plurality of predecoder precharge nodes; and wherein the second threshold voltage is lower than the first threshold voltage.

14. The memory configuration of claim 1:

wherein each of the decoder inverters comprises a p-channel transistor having a first threshold voltage;

wherein each of the plurality of decoders further comprises a p-channel transistor pull-up transistor having a second threshold voltage and having its source connected to receive the precharge voltage and its drain coupled to a corresponding one of the plurality of decoder precharge nodes; and wherein the second threshold voltage is lower than the first threshold voltage.

15. The memory configuration of claim 1:

wherein each of the plurality of predecoder conditional series discharge paths comprises a plurality of n-channel transistors;

wherein at least one n-channel transistor in each of the plurality of predecoder conditional series discharge paths has a threshold voltage lower than a threshold voltage of another n-channel transistor in the predecoder conditional series discharge path;

wherein each of the predecoder inverters comprises a p-channel transistor having a first threshold voltage;

wherein each of the plurality of predecoders further comprises a p-channel transistor pull-up transistor having a second threshold voltage and having its source connected to receive the precharge voltage and its drain coupled to a corresponding one of the plurality of predecoder precharge nodes; and wherein the second threshold voltage is lower than the first threshold voltage.

16. The memory configuration of claim 1:

wherein each of the plurality of decoder conditional series discharge paths comprises a plurality of n-channel transistors;

wherein at least one n-channel transistor in each of the plurality of decoder conditional series discharge paths has a threshold voltage lower than a threshold voltage of another n-channel transistor in the decoder conditional series discharge path;

wherein each of the decoder inverters comprises a p-channel transistor having a first threshold voltage;

wherein each of the plurality of decoders further comprises a p-channel transistor pull-up transistor having a second threshold voltage and having its source connected to receive the precharge voltage and its drain coupled to a corresponding one of the plurality of decoder precharge nodes; and wherein the second threshold voltage is lower than the first threshold voltage.

17. The memory configuration of claim 1 wherein, for each of the plurality of predecoder inverters, its corresponding data signal has an enabling transition and a disabling transition, and wherein the enabling transition is faster than the disabling transition.

18. The memory configuration of claim 1 wherein, for each of the plurality of precharge output signal circuits, its corresponding precharge output signal has an enabling transition and a disabling transition, and wherein the enabling transition is faster than the disabling transition.

19. A memory configuration for outputting information in response to an address, comprising:

an array of memory cells aligned in an array having an integer number N of wordlines;

a plurality of predecoders, each operable to receive a corresponding portion of the address;

a plurality of decoder sets, each having a plurality of wordline enable outputs, wherein each of the plurality of wordline enable outputs corresponds to a respective one of the integer number N of wordlines and is operable to assert an enabling signal to the respective one of the integer number N of wordlines;

wherein each of the plurality of predecoders comprises:

a plurality of predecoder precharge nodes, wherein each of the plurality of predecoder precharge nodes is operable to be precharged to a precharge voltage during a predecoder precharge phase;

a plurality of predecoder conditional series discharge paths, each connected to a corresponding one of the plurality of predecoder precharge nodes and each operable in response to the corresponding portion of the address to discharge the precharge voltage at the corresponding predecoder precharge node during a predecoder evaluate phase; and a plurality of predecoder inverters, each having an input coupled to a corresponding one of the plurality of predecoder precharge nodes and having an output for providing a data signal; and wherein each of the plurality of decoder sets comprises:

a plurality of decoder precharge nodes, wherein each of the plurality of decoder precharge nodes is operable to be precharged to a precharge voltage during a decoder precharge phase;

a plurality of decoder conditional series discharge paths, each connected to a corresponding one of the plurality of decoder precharge nodes and each operable in response to selected ones of the data signals from the plurality of predecoder inverters to discharge the precharge voltage at the corresponding decoder precharge node during a decoder evaluate phase; and a plurality of decoder inverters, each having an input coupled to a corresponding one of the plurality of decoder precharge nodes and having an output for providing one of the plurality of wordline enable outputs; and wherein one of the plurality of predecoders further comprises a plurality of precharge output signal circuits, each coupled to a corresponding one of the plurality of predecoder precharge nodes;

wherein each of the plurality of precharge output signal circuits is for providing a precharge output signal for commencing the decoder precharge phase of a group of the plurality of decoder precharge nodes;

wherein each of the plurality of precharge output signal circuits is operable to selectively provide the precharge output signal to only those decoder precharge nodes which receive an enabling data signal from the one of the plurality of predecoders in an immediately preceding decoder evaluate phase;

wherein the precharge output signal is operable to be asserted by at least one of the plurality of precharge output signal circuits and only after a data signal from the one of the plurality of predecoders in an immediately preceding predecoder evaluate phase is de-asserted; and wherein a data signal from the one of the plurality of predecoders is operable to be asserted only after the precharge output signal from one of the plurality of precharge output signal circuits in an immediately preceding predecoder precharge phase is de-asserted.

20. The memory configuration of claim 19 wherein, for each of the plurality of predecoder inverters, its corresponding data signal has an enabling transition and a disabling transition, and wherein the enabling transition is faster than the disabling transition.

21. The memory configuration of claim 19 wherein, for each of the plurality of precharge output signal circuits, its corresponding precharge output signal has an enabling transition and a disabling transition, and wherein the enabling transition is faster than the disabling transition.

* * * * *